(12) United States Patent
Fang et al.

(10) Patent No.: US 10,840,350 B2
(45) Date of Patent: Nov. 17, 2020

(54) NANOLAMINATE STRUCTURE, SEMICONDUCTOR DEVICE AND METHOD OF FORMING NANOLAMINATE STRUCTURE

(71) Applicants: TAIWAN SEMICONDUCTOR MANUFACTURING CO., LTD., Hsinchu (TW); The Regents of the University of California, Oakland, CA (US)

(72) Inventors: Zi-Wei Fang, Hsinchu County (TW); Hong-Fa Luan, Hsinchu County (TW); Wilman Tsai, Saratoga, CA (US); Kasra Sardashti, La Jolla, CA (US); Maximillian Clemons, La Jolla, CA (US); Scott Ueda, La Jolla, CA (US); Mahmut Kavrik, La Jolla, CA (US); Iljo Kwak, La Jolla, CA (US); Andrew Kummel, La Jolla, CA (US); Hsiang-Pi Chang, New Taipei (TW)

(73) Assignees: TAIWAN SEMICONDUCTOR MANUFACTURING CO., LTD., Hsinchu (TW); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/682,873

(22) Filed: Aug. 22, 2017

(65) Prior Publication Data
US 2018/0122916 A1    May 3, 2018

Related U.S. Application Data

(60) Provisional application No. 62/415,074, filed on Oct. 31, 2016.

(51) Int. Cl.
*H01L 29/66* (2006.01)
*H01L 29/51* (2006.01)
(Continued)

(52) U.S. Cl.
CPC .......... *H01L 29/513* (2013.01); *H01L 21/022* (2013.01); *H01L 21/0228* (2013.01);
(Continued)

(58) Field of Classification Search
CPC . H01L 51/524; H01L 27/3209; H01L 51/003; H01L 51/5253; H01L 51/52;
(Continued)

(56) References Cited

U.S. PATENT DOCUMENTS 6,407,435 B1 * 6/2002 Ma .................... H01L 21/28185
                                                              257/406
8,796,666 B1    8/2014 Huang et al.
(Continued)

OTHER PUBLICATIONS

Kasra Sardashti et al., "Sulfur passivation for the formation of Si-terminated Al2O3/SiGe(0 0 1)interfaces", Applied Surface Science, 366 (2016) 455-463.
(Continued)

*Primary Examiner* — Bitew A Dinke
(74) *Attorney, Agent, or Firm* — McClure, Qualey & Rodack, LLP

(57) ABSTRACT

The present disclosure provides a method of forming a nanolaminate structure. First, a pre-treatment is performed on a semiconductor substrate, in which the semiconductor substrate includes SiGe. Then, a first metal oxide layer is formed on the semiconductor substrate. Then, at least one second metal oxide layer and at least one third metal oxide layer are alternately stacked on the first metal oxide layer, thereby forming a nanolaminate structure. And, a conductive gate layer is formed on the nanolaminate structure.

20 Claims, 33 Drawing Sheets

(51) Int. Cl.
| | |
|---|---|
| H01L 21/02 | (2006.01) |
| H01L 21/8238 | (2006.01) |
| H01L 27/092 | (2006.01) |
| H01L 29/423 | (2006.01) |
| H01L 29/78 | (2006.01) |
| H01L 29/165 | (2006.01) |
| H01L 29/94 | (2006.01) |

(52) U.S. Cl.
CPC .. *H01L 21/02178* (2013.01); *H01L 21/02181* (2013.01); *H01L 21/02192* (2013.01); *H01L 21/02299* (2013.01); *H01L 21/823821* (2013.01); *H01L 21/823828* (2013.01); *H01L 21/823857* (2013.01); *H01L 27/0924* (2013.01); *H01L 29/165* (2013.01); *H01L 29/42364* (2013.01); *H01L 29/512* (2013.01); *H01L 29/517* (2013.01); *H01L 29/66181* (2013.01); *H01L 29/66189* (2013.01); *H01L 29/66545* (2013.01); *H01L 29/66636* (2013.01); *H01L 29/785* (2013.01); *H01L 21/02205* (2013.01); *H01L 21/823807* (2013.01); *H01L 29/94* (2013.01)

(58) Field of Classification Search
CPC ............... H01L 51/0097; H01L 51/56; H01L 2251/5361; H01L 2227/323; H01L 27/3244; H01L 2227/326; H01L 21/823431; H01L 21/823821; H01L 24/845; H01L 27/0886; H01L 2251/5338; Y02P 70/521; Y02E 10/549; H04M 1/0268

See application file for complete search history.

(56) References Cited

U.S. PATENT DOCUMENTS

| | | | |
|---|---|---|---|
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,552,981 B2* | 1/2017 | Yabe | H01L 21/0228 |
| 9,576,814 B2 | 2/2017 | Wu et al. | |
| 2002/0058374 A1* | 5/2002 | Kim | H01L 21/823842 |
| | | | 438/228 |
| 2002/0130340 A1* | 9/2002 | Ma | H01L 21/28185 |
| | | | 257/295 |
| 2002/0153579 A1* | 10/2002 | Yamamoto | H01L 21/28185 |
| | | | 257/412 |
| 2004/0129969 A1* | 7/2004 | Colombo | H01L 21/28194 |
| | | | 257/310 |
| 2004/0171280 A1* | 9/2004 | Conley, Jr. | C23C 16/40 |
| | | | 438/785 |
| 2005/0110115 A1* | 5/2005 | Kil | H01L 21/02178 |
| | | | 257/532 |
| 2005/0136584 A1* | 6/2005 | Boyanov | H01L 29/78 |
| | | | 438/199 |
| 2005/0148137 A1* | 7/2005 | Brask | H01L 21/823821 |
| | | | 438/216 |
| 2006/0017098 A1* | 1/2006 | Doczy | H01L 21/28194 |
| | | | 257/330 |
| 2006/0151823 A1* | 7/2006 | Govindarajan | H01L 21/3142 |
| | | | 257/310 |
| 2007/0023842 A1* | 2/2007 | Jung | H01L 21/28088 |
| | | | 257/369 |
| 2008/0173947 A1* | 7/2008 | Hou | H01L 21/823835 |
| | | | 257/369 |
| 2009/0057769 A1* | 3/2009 | Wei | H01L 21/82345 |
| | | | 257/369 |
| 2009/0246971 A1* | 10/2009 | Reid | C23C 16/02 |
| | | | 438/778 |
| 2010/0209702 A1* | 8/2010 | Tsai | C23C 16/40 |
| | | | 428/336 |
| 2010/0239758 A1* | 9/2010 | Kher | C23C 16/0218 |
| | | | 427/255.31 |
| 2014/0065809 A1* | 3/2014 | Kim | H01L 21/28008 |
| | | | 438/586 |
| 2014/0361378 A1* | 12/2014 | Lee | H01L 27/0928 |
| | | | 257/369 |
| 2015/0311341 A1* | 10/2015 | Hur | H01L 21/02532 |
| | | | 257/190 |
| 2016/0225673 A1* | 8/2016 | Niimi | H01L 21/823807 |
| 2016/0225676 A1* | 8/2016 | Jacob | H01L 21/845 |
| 2016/0329327 A1* | 11/2016 | Lee | H01L 27/0886 |
| 2016/0379981 A1* | 12/2016 | Balakrishnan | H01L 27/0924 |
| | | | 257/192 |
| 2017/0125551 A1* | 5/2017 | Cheng | H01L 29/66795 |
| 2017/0133379 A1* | 5/2017 | Kim | H01L 27/0924 |
| 2017/0141226 A1* | 5/2017 | Jacob | H01L 29/7848 |
| 2017/0250183 A1* | 8/2017 | Brunco | H01L 29/1083 |
| 2017/0278845 A1* | 9/2017 | Tung | H01L 21/30625 |
| 2017/0352766 A1* | 12/2017 | Delabie | H01L 21/02568 |
| 2018/0006048 A1* | 1/2018 | Tsukamoto | H01L 29/40117 |
| 2018/0158925 A1* | 6/2018 | Cheng | H01L 21/823418 |

OTHER PUBLICATIONS

W.-C. Hua et al., "Ge Outdiffusion Effect on Flicker Noise in Strained-Si nMOSFETs", IEEE Electron Device Letters, vol. 25 No. 10 Oct. 2004, p. 693-695.

N. Lu et al., "Ge diffusion in Ge metal oxide semiconductor with chemical vapor deposition HfO2 dielectric", Applied Physics Letters 87, 051922 (2005).

P. Hashemi et al., "High-Mobility High-Ge-Content Si1-xGex-OI PMOS FinFETs with Fins Formed Using 3D Germanium Condensation with Ge Fraction up to x~ 0.7, Scaled EOT~8.5Å and ~10nm Fin Width", Symposium on VLSI Technology Digest of Technical Papers, (2015) T16-17.

Darsen Lu, et al., "Silicon Germanium FinFET Device Physics, Process Integration and Modeling Considerations", ECS Transactions, 64 (6) 337-345, (2014).

D. W. Greve, "Growth of epitaxial germanium-silicon heterostructures by chemical vapor-deposition", Materials Science and Engineering, B18 (1993) 22-51.

Kelin J. Kuhn, "Considerations for Ultimate CMOS Scaling", IEEE Transactions on Electron Devices, vol. 59, No. 7 Jul. 2012.

John Robertson et al., "High-K materials and metal gates for CMOS applications", Materials Science and Engineering R 88 (2015) 1-41.

J.-H. Han et al., "Impact of plasma post-nitridation on HfO2/Al2O3/SiGe gate stacks toward EOT scaling", Microelectronic Engineering 109 (2013) 266-269.

Kasra Sardashti et al., "Nitride passivation of the interface between high-k dielectrics and SiGe", Applied Physics Letters 108, 011604 (2016).

D. Wu et al., "Structural and electrical characterization of Al2O3/HfO2/Al2O3 on strained SiGe", Solid-State Electronics 49 (2005) 193-197.

E. H. Nicollian et al., "Mos (Metal-Oxide Semiconductor) Physics and Technology", Wiley: Mos (Metal-Oxide Semiconductor) American Scientist vol. 71 No. 5 (1983) p.549.

* cited by examiner

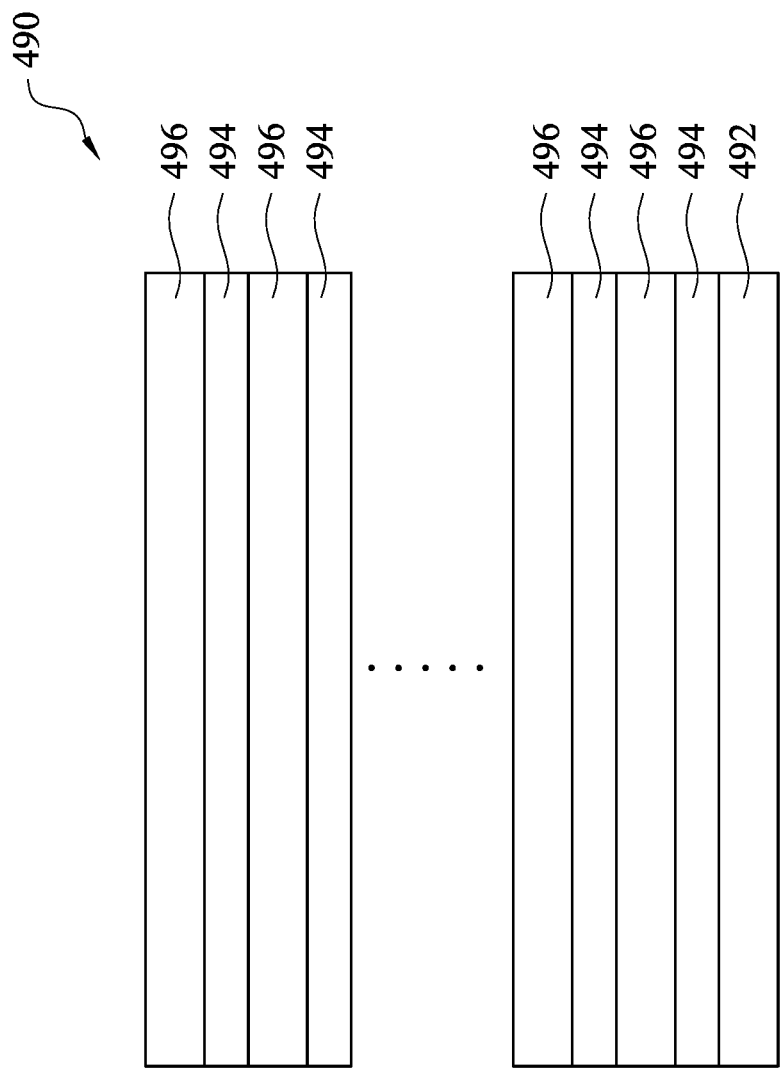

US 10,840,350 B2

NANOLAMINATE STRUCTURE, SEMICONDUCTOR DEVICE AND METHOD OF FORMING NANOLAMINATE STRUCTURE

PRIORITY CLAIM AND CROSS-REFERENCE

This application claims the benefit of the Provisional Application Ser. No. 62/415,074, filed on Oct. 31, 2016. The entire disclosures of all the above applications are hereby incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs, and for these advances to be realized, similar developments in IC processing and manufacturing are needed. For example, a three dimensional device, such as a fin-like field-effect device (FinFET), has been introduced to replace a planar device. However, defects in interfaces between a semiconductor substrate and a gate oxide layer (e.g. a high k material layer of a gate structure) of the semiconductor device and diffusion of elements (e.g. germanium) from the semiconductor substrate into the gate oxide layer may cause gate current leakages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A and FIG. 2B are schematic cross-sectional views of a semiconductor device having a nanolaminate structure in accordance with various embodiments of the present disclosure, in which FIG. 2B is a schematic cross-sectional view cut from the section line A-A' of the PMOS and the sectional line B-B' of the NMOS of FIG. 2A.

FIG. 4A to FIG. 4Q are schematic cross-sectional views of intermediate stages showing a method for forming a nanolaminate structure in accordance with various embodiments of the present disclosure, in which FIG. 4G, FIG. 4I, FIG. 4K, FIG. 4M, FIG. 4O, and FIG. 4Q are schematic cross-sectional views cut from the section line A-A' of the PMOS and the sectional line B-B' of the NMOS of FIG. 4F, FIG. 4H, FIG. 4J, FIG. 4L, FIG. 4N and FIG. 4P.

DETAILED DESCRIPTION

Figure 1A:
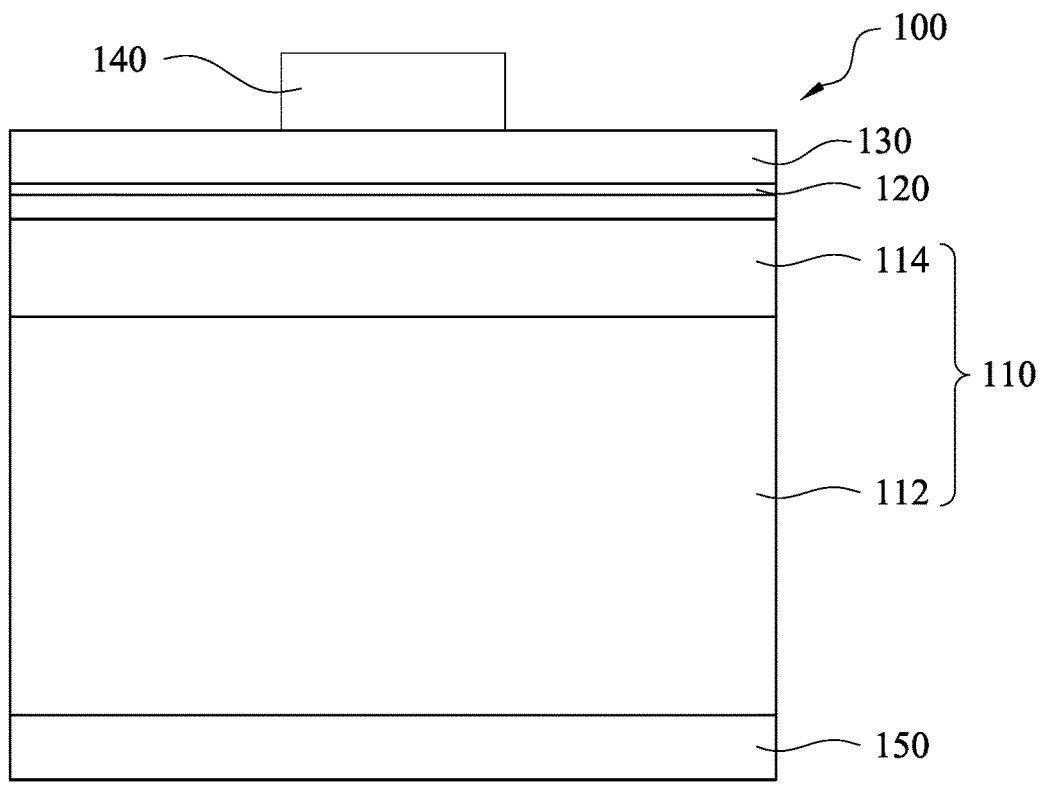
FIG. 1A is a schematic cross-sectional view of a nanolaminate structure in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A passivation layer containing sulfur (S) is typically introduced to reduce diffusion of elements from a semiconductor substrate into a gate oxide layer, but the sulfur atoms may lead to a reliability issue in the gate oxide layer under a large electric field. On the other hand, an oxide bi-layer structure or an oxide tri-layer structure is applied to tackle the aforementioned problems, but the oxide bi-layer structure or an oxide tri-layer structure may face the issues of small dielectric constant and large thickness. Embodiments of the disclosure are directed to providing a nanolaminate structure, a semiconductor device and a method of forming the nanolaminate structure, in which a first metal oxide layer, and alternately stacked second metal oxide layers as well as third metal oxide layers are formed on a semiconductor substrate, thereby forming the nanolaminate structure. The nanolaminate structure formed on the semiconductor substrate (e.g. a SiGe substrate or a Si substrate) helps to decrease defects in gate oxide layer-semiconductor substrate interfaces (i.e. a density of the interface trap) by restricting formation of oxides such as germanium oxide, and diffusion of elements in the semiconductor substrate (for example, Ge or germanium oxide), thereby improving problems such as gate current leakages. In addition, an equivalent oxide thickness (EOT) substantially equal to or smaller than 1.5 nm is realized in the nanolaminate structure of the present disclosure, and thus the nanolaminate structure of the present disclosure is advantageous in scaling down the size of a semiconductor device. In some embodiments, the semiconductor device of the present disclosure includes a metal oxide semiconductor capacitor (MOSCAP), a fin field device (FinFET) complementary metal oxide semiconductor (CMOS) device, a FinFET PMOS or a FinFET NMOS.

FIG. 1A illustrates a schematic cross-sectional view of a nanolaminate structure 100 in accordance with various embodiments of the present disclosure. In FIG. 1A, the nanolaminate structure includes a semiconductor substrate 110, a first metal oxide layer 120 disposed on the semiconductor substrate 110, a layer 130 disposed on the first metal oxide layer 120 and a conductive gate layer 140 disposed on the layer 130. In some embodiments, the semiconductor substrate 110 includes a multi-layered structure such as a silicon-germanium layer 114 formed on a bulk silicon layer 112. In other embodiments, the semiconductor substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 110. Alternatively, the silicon semiconductor substrate 110 may be an active layer of a semiconductor-on-insulator (SOI) substrate. In some embodiments, the first metal oxide layer 120 includes aluminum oxide ($Al_2O_3$), lanthanum oxide ($La_2O_3$) or yttrium oxide ($Y_2O_3$). In some embodiments, the conductive gate layer 140 may include polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

Figure 1B:
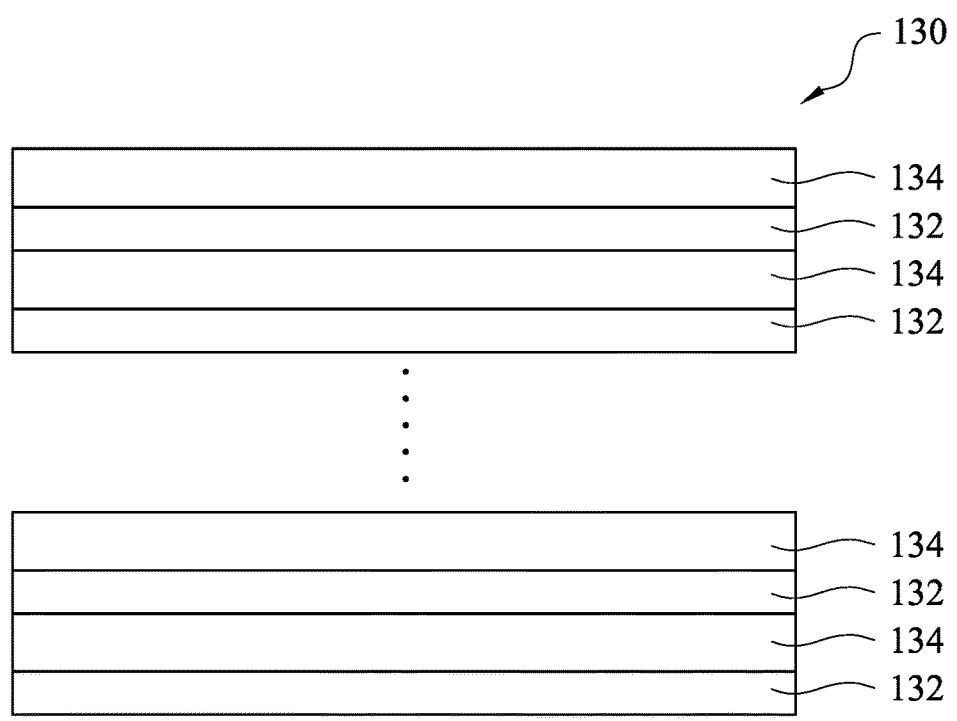
FIG. 1B is a schematic cross-sectional view of the nanolaminate layer of FIG. 1A in accordance with various embodiments of the present disclosure.

Referring to FIG. 1B, in which FIG. 1B illustrates a schematic cross-sectional view of the layer 130 of FIG. 1A in accordance with various embodiments of the present disclosure. In FIG. 1B, the layer 130 includes alternately stacked at least one second metal oxide layers 132 and at least one third metal oxide layers 134. In some embodiments, each of the second metal oxide layers 132 includes hafnium oxide ($HfO_2$). In some embodiments, each of the third metal oxide layers 134 includes aluminum oxide ($Al_2O_3$), lanthanum oxide ($La_2O_3$) or yttrium oxide ($Y_2O_3$). In yet embodiments, the first metal oxide layer 120 and the third metal oxide layer 134 are same or different.

Referring to FIG. 1A again, the nanolaminate structure may further include a back contact layer 150 disposed on a backside of the semiconductor substrate 110. In some embodiments, the back contact layer 150 may include, for example, aluminum. In some embodiments, the nanolaminate structure 100 may be, for example, a metal oxide semiconductor capacitor (MOSCAP).

Figure 2A:
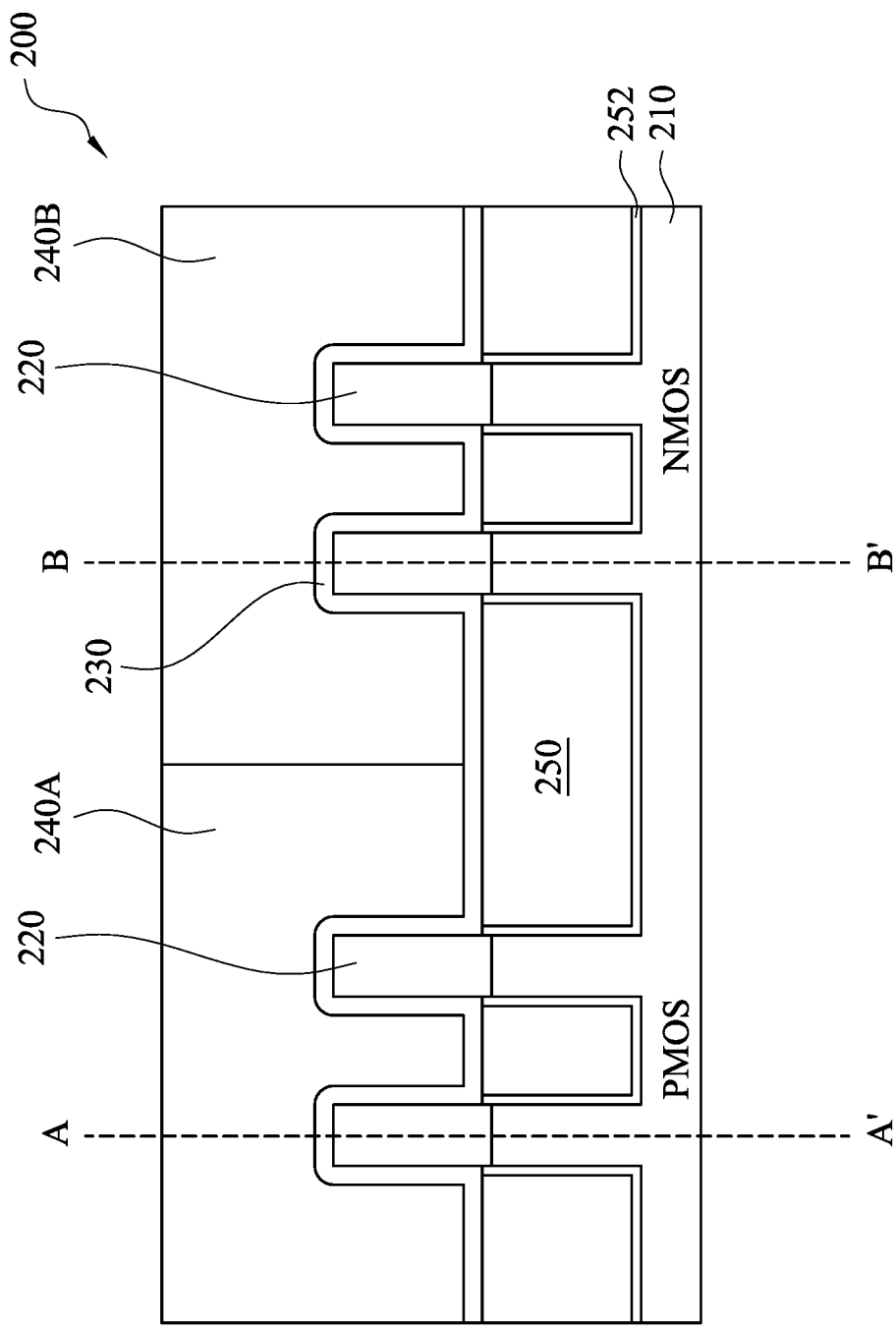
Figure 2B:
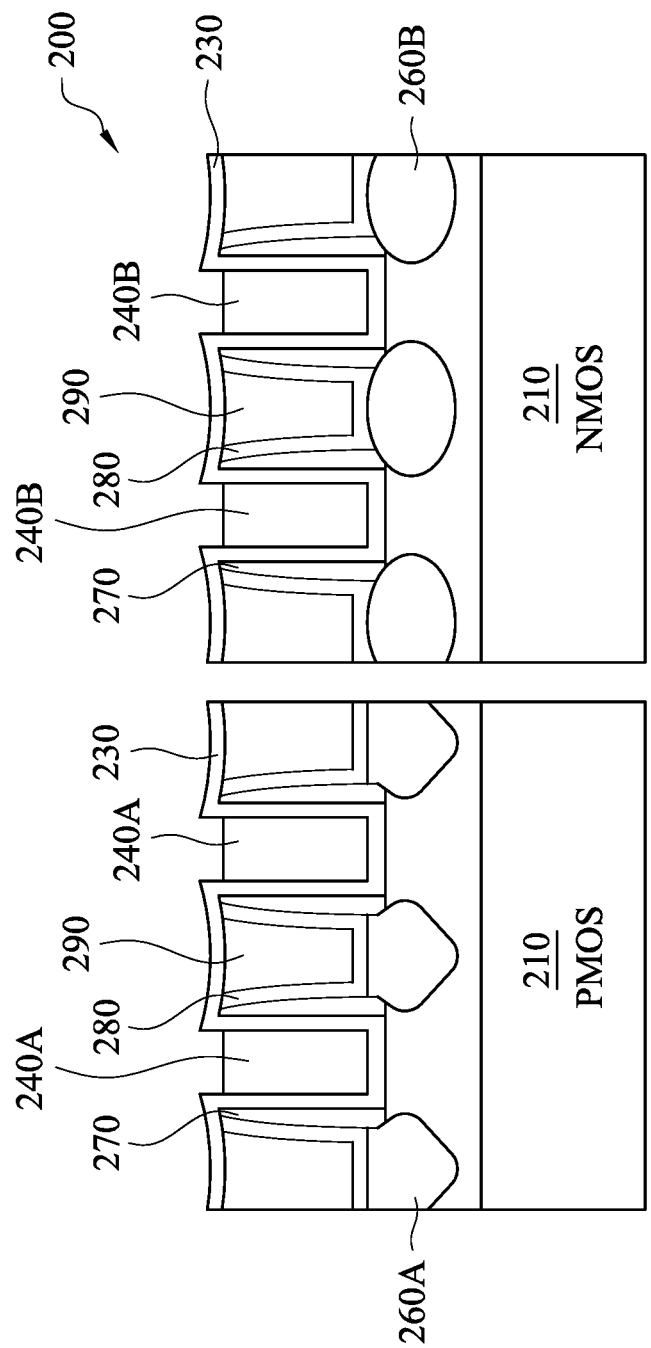

FIG. 2A and FIG. 2B illustrate schematic cross-sectional views of a semiconductor device having a nanolaminate structure in accordance with various embodiments of the present disclosure, in which FIG. 2B is a schematic cross-sectional view cut from the section line A-A' of the PMOS and the sectional line B-B' of the NMOS of FIG. 2A. The semiconductor device 200 includes a substrate 210, fins 220 disposed on the semiconductor substrate 210, a nanolaminate structure 230 disposed on the fin 220 and above the semiconductor substrate 210, and metal gates (e.g. a p-metal gate 240A or a n-metal gate 240B) disposed on the nanolaminate structure 230. In some embodiments, the semiconductor device 200 may further include an isolation structure 250, source/drain structures 260A and 260B, spacers 270, contact edge stop layer (CESL) 280, and an interlayer dielectric layer 290 (as shown in FIG. 2B). It is noted that FIG. 2A and FIG. 2B illustrate a PMOS device and a NMOS device simultaneously (i.e. a CMOS device), however, the PMOS device and the NMOS device may exist as an independent device. In some embodiments, semiconductor device 200 may include only one fin and only one metal gate.

In some embodiments, the semiconductor substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 210. Alternatively, the silicon substrate may be an active layer of a semiconductor-on-insulator (SOI) substrate or a multi-layered structure such as a silicon-germanium layer formed on a bulk silicon layer. In some embodiments, the fins 220 are formed by the semiconductor substrate 210 and include the same material as the semiconductor substrate 210. For example, the fins 220 of the NMOS device may include silicon. In other example, the fins 220 of the PMOS device may include silicon germanium (SiGe).

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 2C:
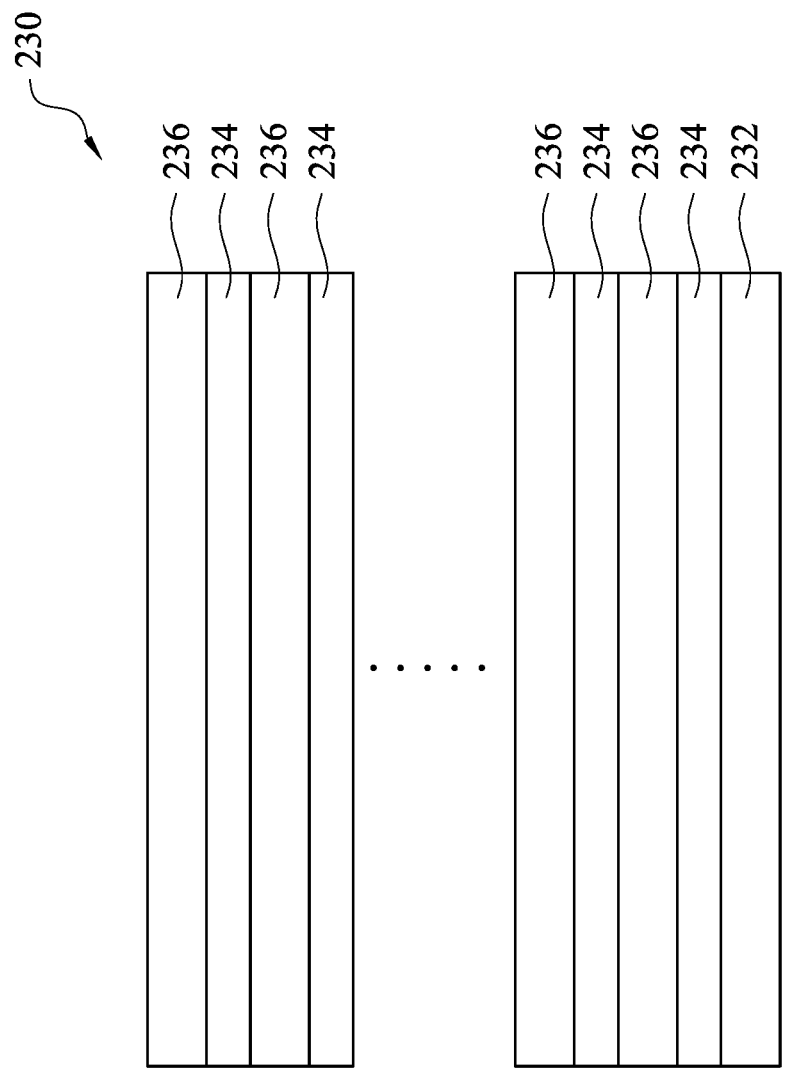
FIG. 2C is a schematic cross-sectional view of the nanolaminate structure of FIG. 2A in accordance with various embodiments of the present disclosure.

Referring to FIG. 2C, which illustrates a schematic cross-sectional view of the nanolaminate structure 230 of FIG. 2A in accordance with various embodiments of the present disclosure. In FIG. 2C, the nanolaminate structure 230 includes a first metal oxide layer 232, a plurality of second metal oxide layers 234 and a plurality of third metal oxide layers 236, in which the first metal oxide layer 232 is disposed on the fin 220, and the plurality of second metal oxide layers 234 and the plurality of third metal oxide layers 236 are alternately stacked on the first metal oxide layer 232. In some embodiments, one of the plurality of the second metal oxide layers 234 is directly disposed on the first metal oxide layer 232. In some embodiments, the second metal oxide layer 234 includes hafnium oxide ($HfO_2$), and the first metal oxide layer 232 and the plurality of the third metal oxide layers 236 respectively include aluminum oxide ($Al_2O_3$), lanthanum oxide ($La_2O_3$) or yttrium oxide ($Y_2O_3$).

Figure 3A:
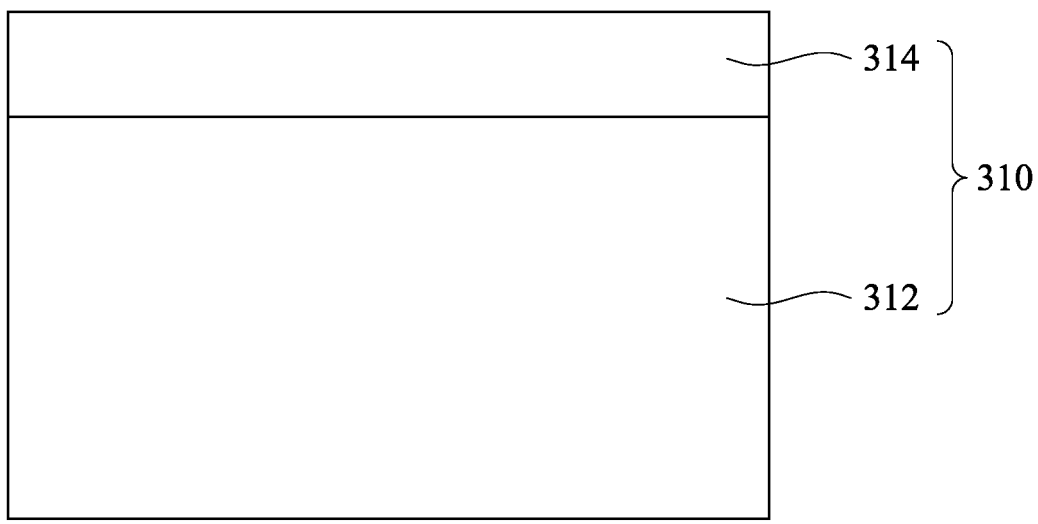
FIG. 3A to FIG. 3E are schematic cross-sectional views of intermediate stages showing a method for forming a nanolaminate structure in accordance with various embodiments of the present disclosure.

FIG. 3A to FIG. 3D illustrates schematic cross-sectional views of intermediate stages showing a method for forming a nanolaminate structure in accordance with various embodiments of the present disclosure. In FIG. 3A, a semiconductor substrate 310 is provided in an atomic layer deposition (ALD) reacting chamber (not shown) first. In some embodiments, the ALD reacting chamber includes a low vacuum cross-flow reactor with continuous argon flow and base pressure of 1.5 torr to 2 torr, or a high vacuum showerhead reactor with base pressure $3 \times 10^{-6}$ torr-$6 \times 10^{-6}$ torr. In some embodiments, semiconductor substrate 310 includes a multi-layered structure such as a silicon-germanium layer 314 formed on a bulk silicon layer 312. In other embodiments, the semiconductor substrate 310 may include bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 310. Alternatively, the silicon substrate may be an active layer of a semiconductor-on-insulator (SOI) substrate.

Figure 3B:
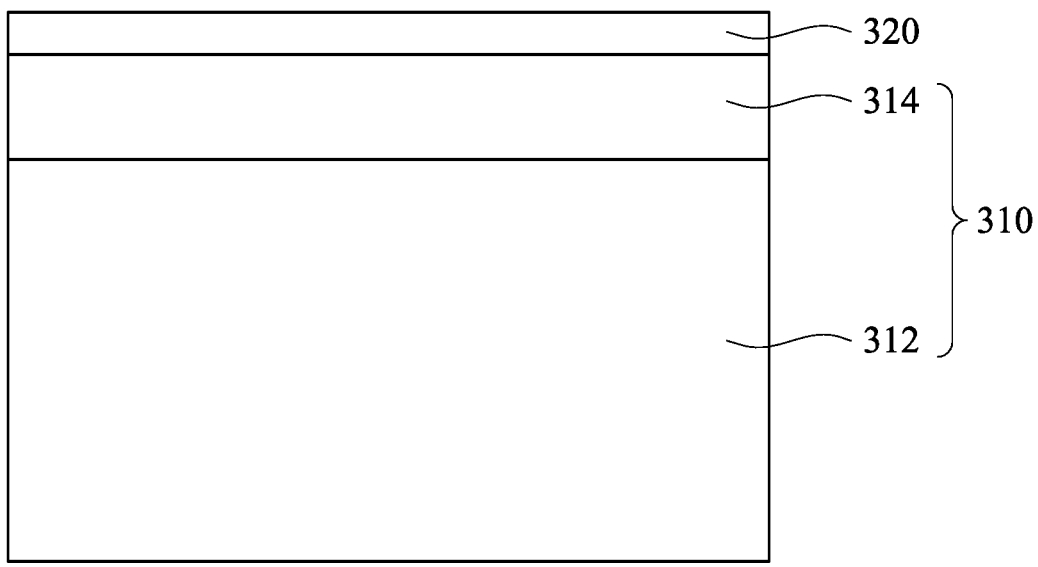

Next, as shown in FIG. 3B, a pre-treatment is performed on the semiconductor substrate 310 and a first metal oxide layer 320 is formed on the semiconductor substrate 310, for example, by atomic layer deposition (ALD). In some embodiments, the pre-treatment is performed by using a hydrogen fluoride (HF) solution and deionized water to clean a surface of the semiconductor substrate 310 at 25° C., in which the HF solution may have a concentration of about 2 weight percent (wt. %). In some embodiments, forming the first metal oxide layer 320 on the semiconductor substrate 310 may include alternately flowing a first source including aluminum, lanthanum or yttrium over the semiconductor substrate 310, and flowing an oxygen source over the semiconductor substrate 310 (i.e. alternately providing the first source and the oxygen source into the reacting chamber). In some embodiments, the first source may include trimethylaluminum (TMA), triethylaluminum (TEA), yttrium(III) tris(2,2,6,6-tetramethyl-3,5-heptanedionate) ($Y(TMHD)_3$), yttrium tris(N,N'-diisopropylacetamidinate), tris[isopropyl-cyclopentadienyl]yttria ($Y(iPrCp)_3$), lanthanum tris-formamidinate (($LaFAMD)_3$), tris(dipivaloylmethanato)lanthanum, tris(isopropylcyclopentadienyl)lanthanum (($iPrCp)_3La$), or tris(2,2,6,6-tetramethyl-3,5-heptanedionato)lanthanum(III) tetraglyme ($La(TMHD)_3$ tetraglyme). In some embodiments, the oxygen source includes water, oxygen or ozone. In some embodiments, the first metal oxide layer 320 includes aluminum oxide ($Al_2O_3$), lanthanum oxide ($La_2O_3$) or yttrium oxide ($Y_2O_3$). In some embodiments, the first metal oxide layer is formed at a temperature lower than 100° C. In one example, the first metal oxide layer 320 is formed by 10 times of alternately flowing TMA over the semiconductor substrate 310 for 200 ms, and flowing the oxygen source over the semiconductor substrate 310 for 50 ms at 50° C. In further embodiments, a pre-pulse operation may be performed between the pre-treatment and the operation of forming the first oxide layer, in which the first source is discontinuously applied over the semiconductor substrate 310. For example, the pre-pulse operation may be performed by 20 times of discontinuously flowing the first source on the semiconductor substrate 310 for 45 ms each time. In some embodiments, an Ar-pulse may be applied each time before the applied source is changed. For example, the Ar-pulse may be applied between flowing the first source over the semiconductor substrate 310 and flowing the oxygen source over the semiconductor substrate 310 for about 6 seconds. It is noted that each time of flowing the first source and flowing the oxygen source forms a single metal oxide layer, therefore the first metal oxide layer 320 substantially includes a plurality of metal oxide layers.

Figure 3C:
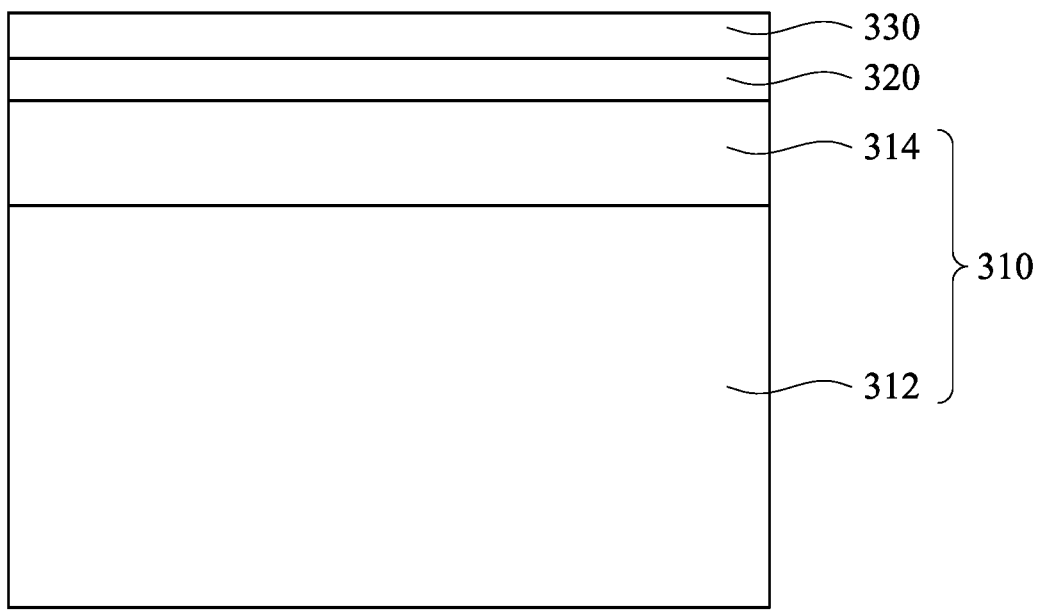
Figure 3D:
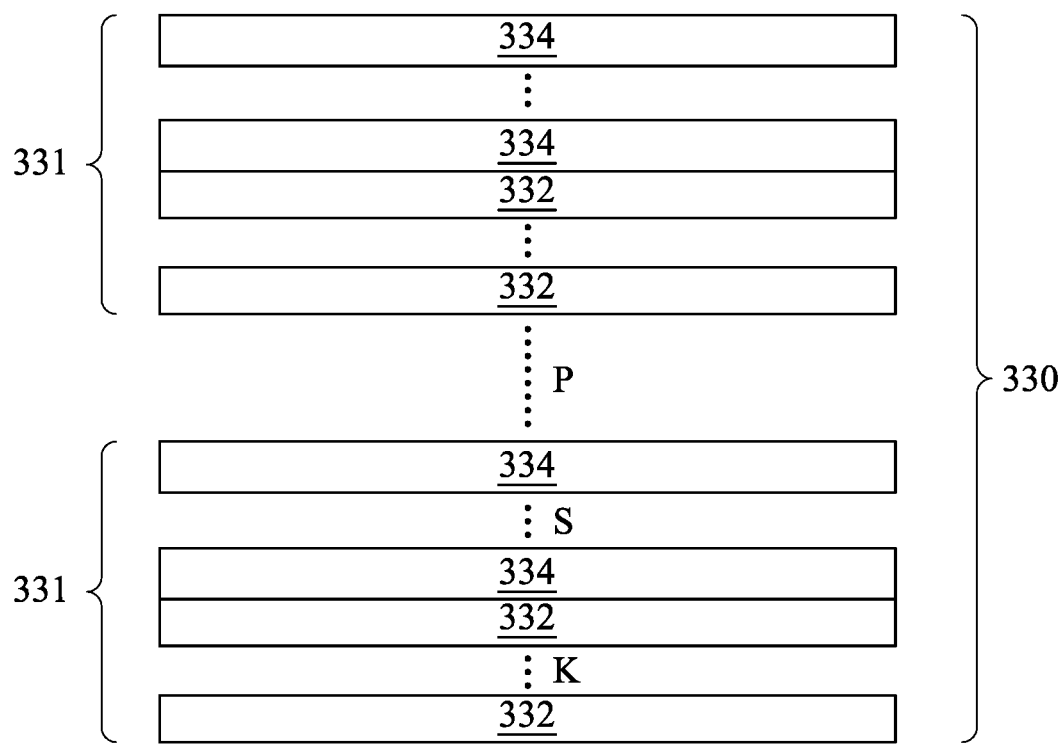

In FIG. 3C and FIG. 3D, a layer 330 is formed on the first metal oxide layer 320, in which the nanolaminate layer 330 is formed by alternately stacking at least one second metal oxide layer 332 and at least one third metal oxide layer 334 on the first metal oxide layer 320. In some embodiments, alternately stacking the at least one second metal oxide layer 332 and the at least one third metal oxide layer 334 on the first metal oxide layer 320 includes alternately flowing the first source including aluminum, lanthanum or yttrium over the first metal oxide layer 320, and flowing the oxygen source over the first metal oxide layer 320 (i.e. alternately providing the first source and the oxygen source into the reacting chamber). In some embodiments, alternately stacking the at least one second metal oxide layer 332 and the at least one third metal layer 334 on the first metal oxide layer 320 includes alternately flowing a second source including hafnium over the first metal oxide layer 320, and flowing the oxygen source over the first metal oxide layer 320 (i.e. alternately providing the second source and the oxygen source into the reacting chamber). Each time of flowing the first source or the second source and flowing the oxygen source forms a single metal oxide layer. In some embodiments, the first source includes TMA, TEA, $Y(TMHD)_3$, yttrium tris(N,N'-diisopropylacetamidinate), $Y(iPrCp)_3$, $(LaFAMD)_3$, $(iPrCp)_3La$, or $La(TMHD)_3$ tetraglyme. In some embodiments, the second source includes hafnium tetrachloride ($HfCl_4$), tetrakis(dimethylamido)hafnium (TDMAH) or tetrakis(ethylmethylamino)hafnium (TEMAH). In some embodiments, the oxygen source includes water, oxygen or ozone. In some embodiments, the layer 330 is formed at a temperature substantially in a range from 120° C. to 300° C. When the temperature is higher than 300° C., diffusion of the components such as Ge or $GeO_x$ is likely to occur, however, when the temperature is lower than 120° C., the layer 330 cannot be formed due to low reactivity of the first source and the second source. In some embodiments, one of the second layers 332 is directly formed on the first metal oxide layer 320. In some embodiments, the pre-pulse operation mentioned before may be also performed prior to stacking the third metal oxide layer 334, thereby increasing a density of the third metal oxide layer 334 to further inhibit the diffusion of elements in the semiconductor substrate 310.

In some embodiments, the second metal oxide layer 332 includes $HfO_2$. In some embodiments, the third metal oxide layer 334 includes $Al_2O_3$, $La_2O_3$ or $Y_2O_3$. In yet embodiments, the first metal oxide layer 320 and the third metal oxide layer 334 are the same; alternatively, the first metal oxide layer 320 and the third metal oxide layer 334 are different.

In a certain embodiment, the second metal oxide layer 332 is formed by alternately flowing TDMAH over the semiconductor substrate 310 (or on the first metal oxide layer 320) for 500 ms, and flowing the oxygen source over the semiconductor substrate 310 (or on the first metal oxide layer 320) for 500 ms at 250° C.; and the third metal oxide layer 334 is formed by alternately flowing TMA over the semiconductor substrate 310 for 200 ms, and flowing the oxygen source over the semiconductor substrate 310 for 50 ms at 250° C. In a certain embodiment, the second metal oxide layer 332 is formed by alternately flowing $HfCl_4$ over the semiconductor substrate 310 for 500 ms, and flowing the oxygen source over the semiconductor substrate 310 for 500 ms at 300° C.; and, the third metal oxide layer 334 is formed at 300° C. according to the method mentioned as the above embodiment. In a certain embodiment, the second metal oxide layer 332 is formed by alternately flowing TEMAH over the semiconductor substrate 310 (or on the first metal oxide layer 320) for 500 ms, and flowing the oxygen source over the semiconductor substrate 310 (or on the first metal oxide layer 320) for 500 ms at 120° C.; and, the third metal oxide layer 334 is formed at 120° C. according to the method mentioned as the above embodiment.

In some embodiments, K layers of the second metal oxide layer 332 is formed first, followed by S layers of the third metal oxide layer 334 formed on the second metal oxide layers 332, thereby forming a sub-nanolaminate structure 331. And the nanolaminate layer 330 includes P layers of the sub-nanolaminate structure 331 as shown in FIG. 3D. In a certain embodiment, K is 9, S is 1 and P is 4. The other certain embodiments are shown as Table 1. In some embodiments, the nanolaminate structure of the present disclosure may have an equivalent oxide thickness (EOT) smaller than 1.5 nm and a reduced density of interface trap (e.g. relatively reduced by 35%).

TABLE 1

| Embodiments | 1 | 2 | 3 | 4 | 5 | 6 | 7 |
|---|---|---|---|---|---|---|---|
| K (layers) | 9 | 3 | 1 | 3 | 5 | 7 | 9 |
| S (layers) | 1 | 1 | 1 | 1 | 1 | 1 | 1 |
| P (layers) | 4 | 10 | 24 | 12 | 8 | 6 | 5 |

Figure 3E:
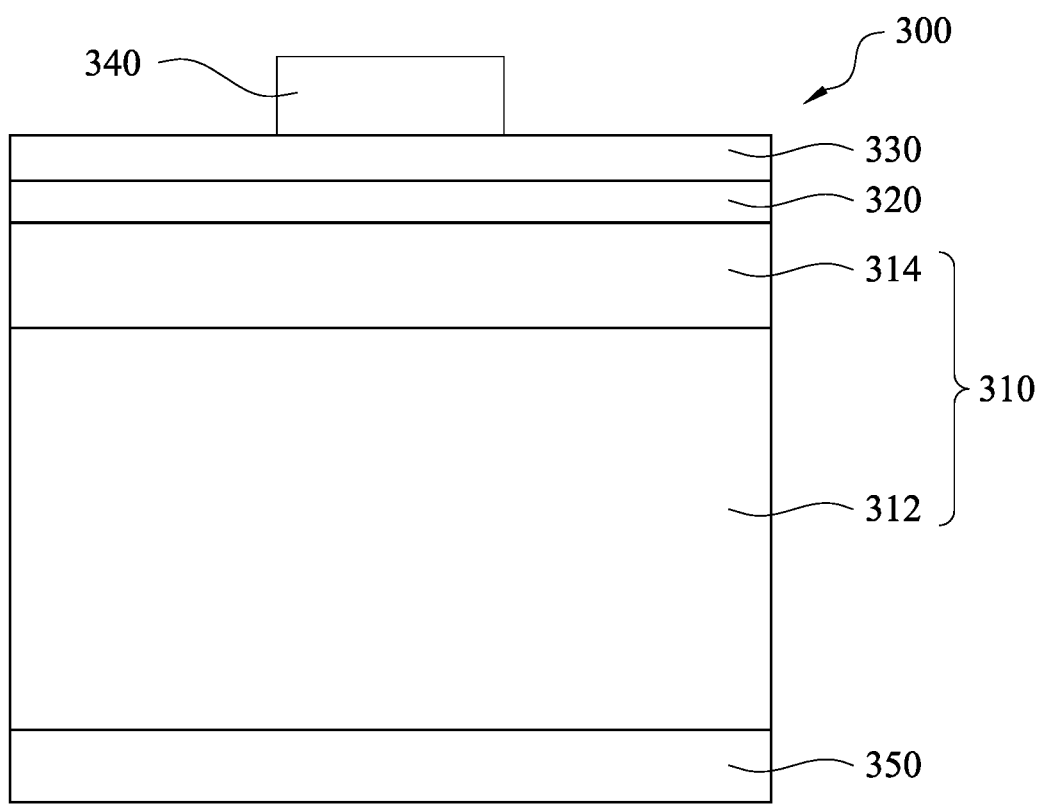

In FIG. 3E, a conductive gate layer 340 may be formed on the layer 330 by, for example, depositing a conductive material thereon, and a back contact layer 350 may be formed on a backside of the semiconductor substrate 310, thereby forming a nanolaminate structure 300. In some embodiments, the conductive gate layer 340 may include polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc. In some embodiments, the back contact layer 350 may include, for example, aluminum.

In some embodiments, the nanolaminate structure 300 may be, for example, a MOSCAP, and an annealing process may be applied after the nanolaminate structure 300 is formed. In a certain embodiment, the annealing process may be performed at 250° C. for 15 minutes in an atmosphere of 5% of hydrogen gas and 95% of nitrogen gas.

Figure 4A:
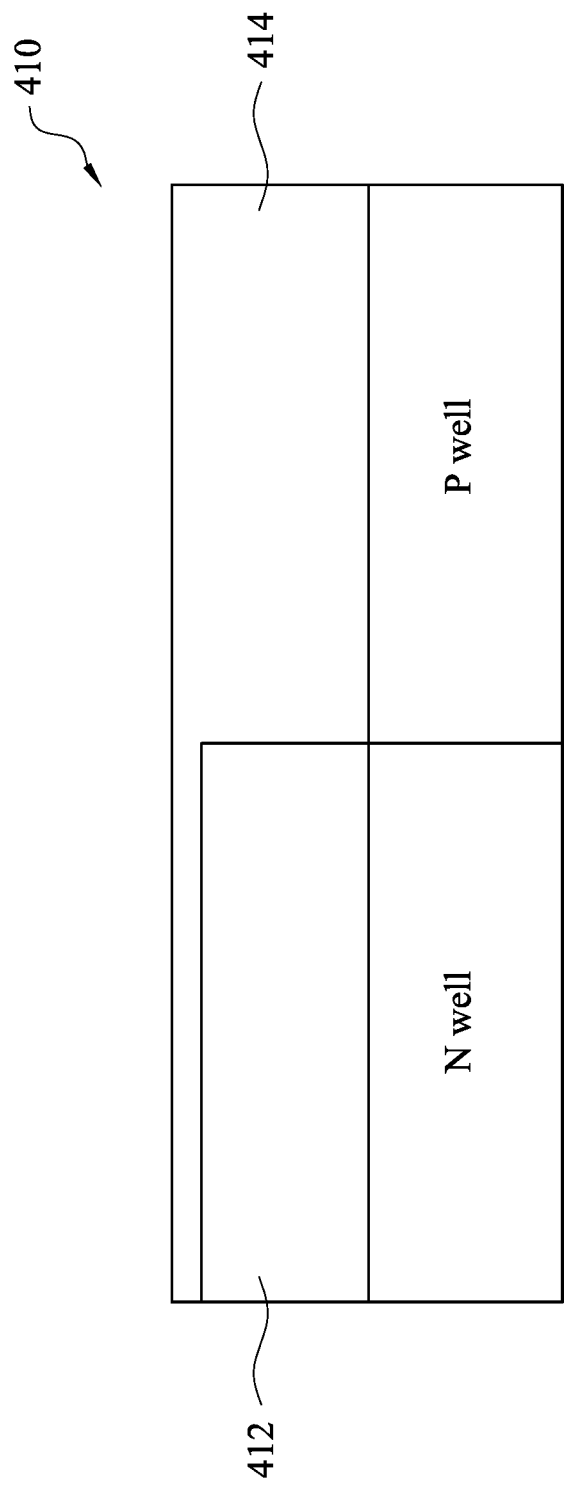
Figure 4B:
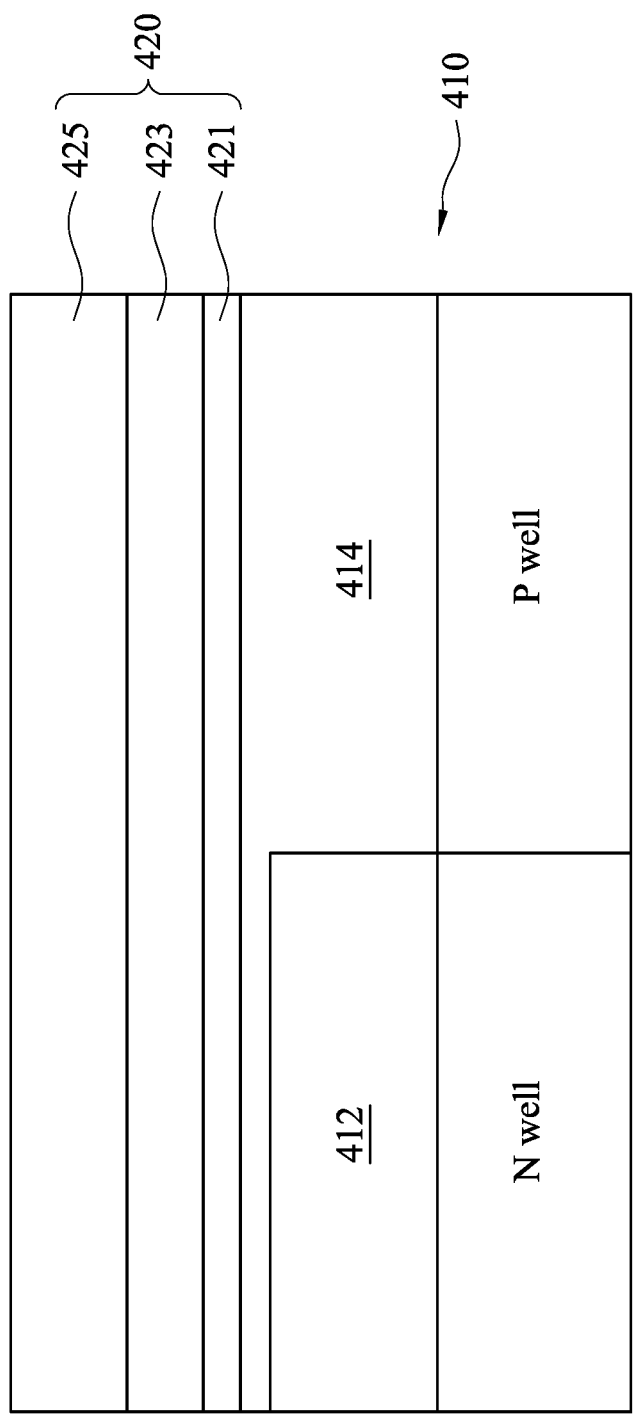
Figure 4C:
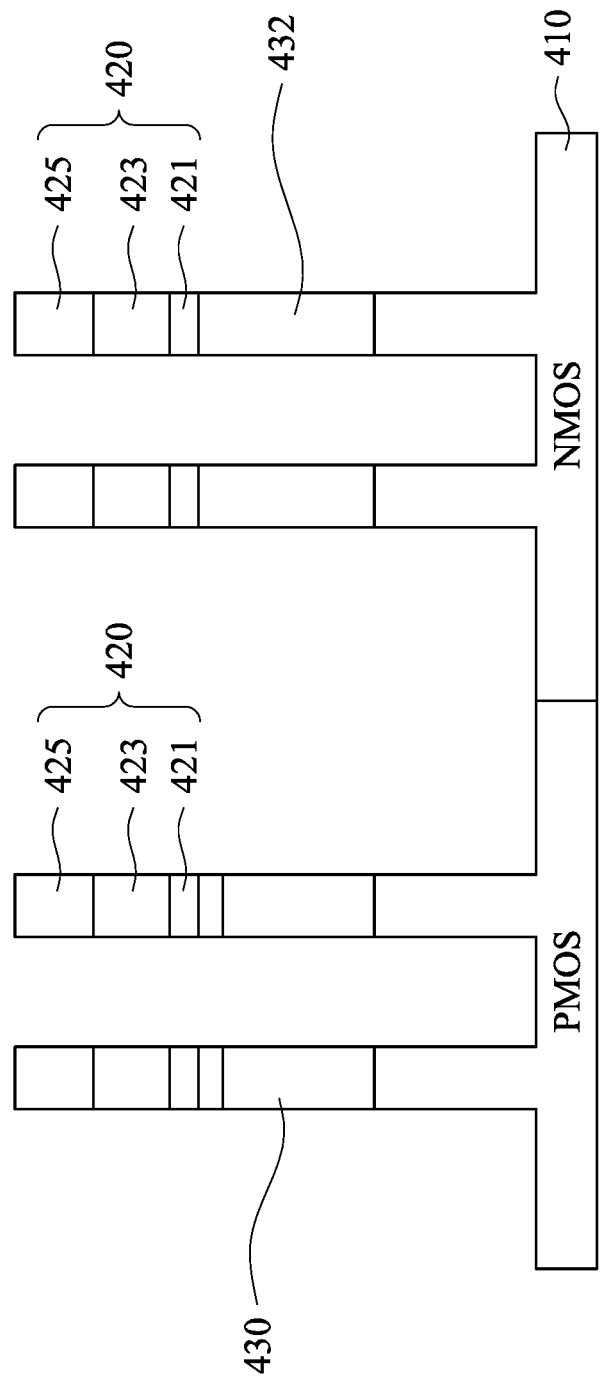
Figure 4D:
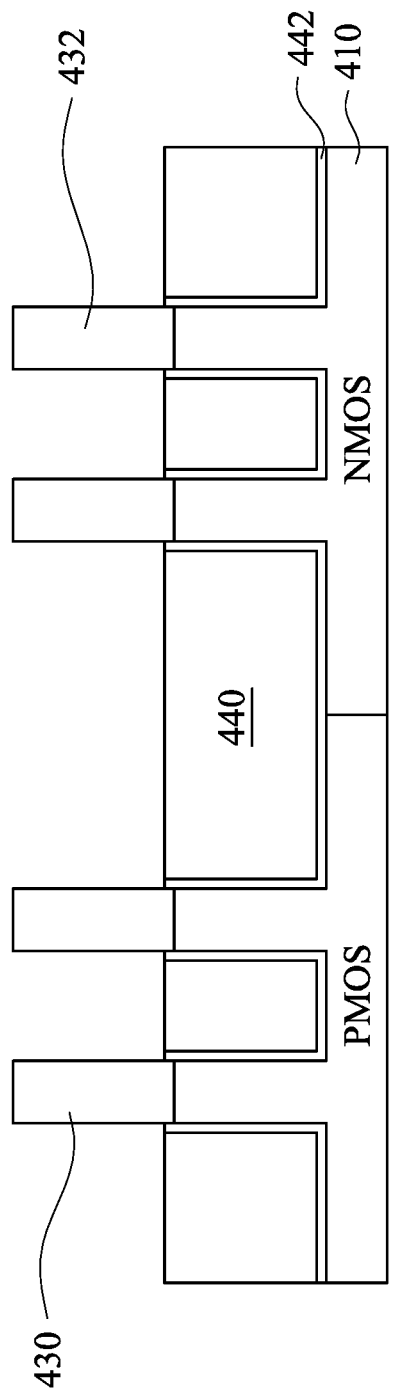
Figure 4E:
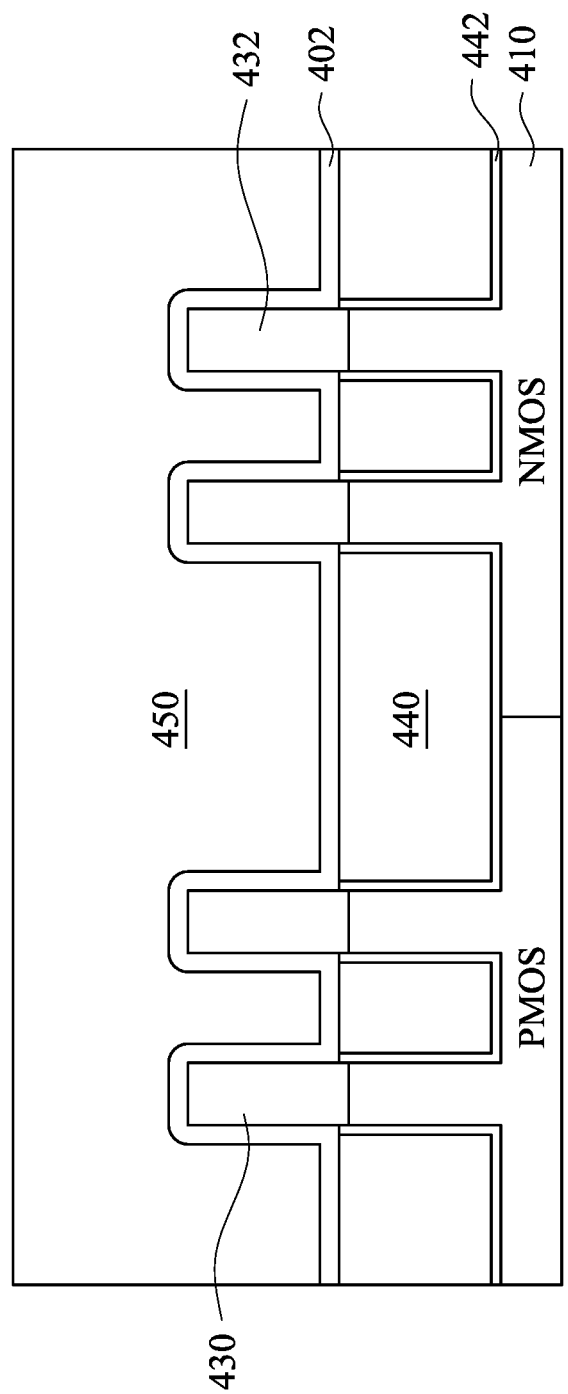
Figure 4F:
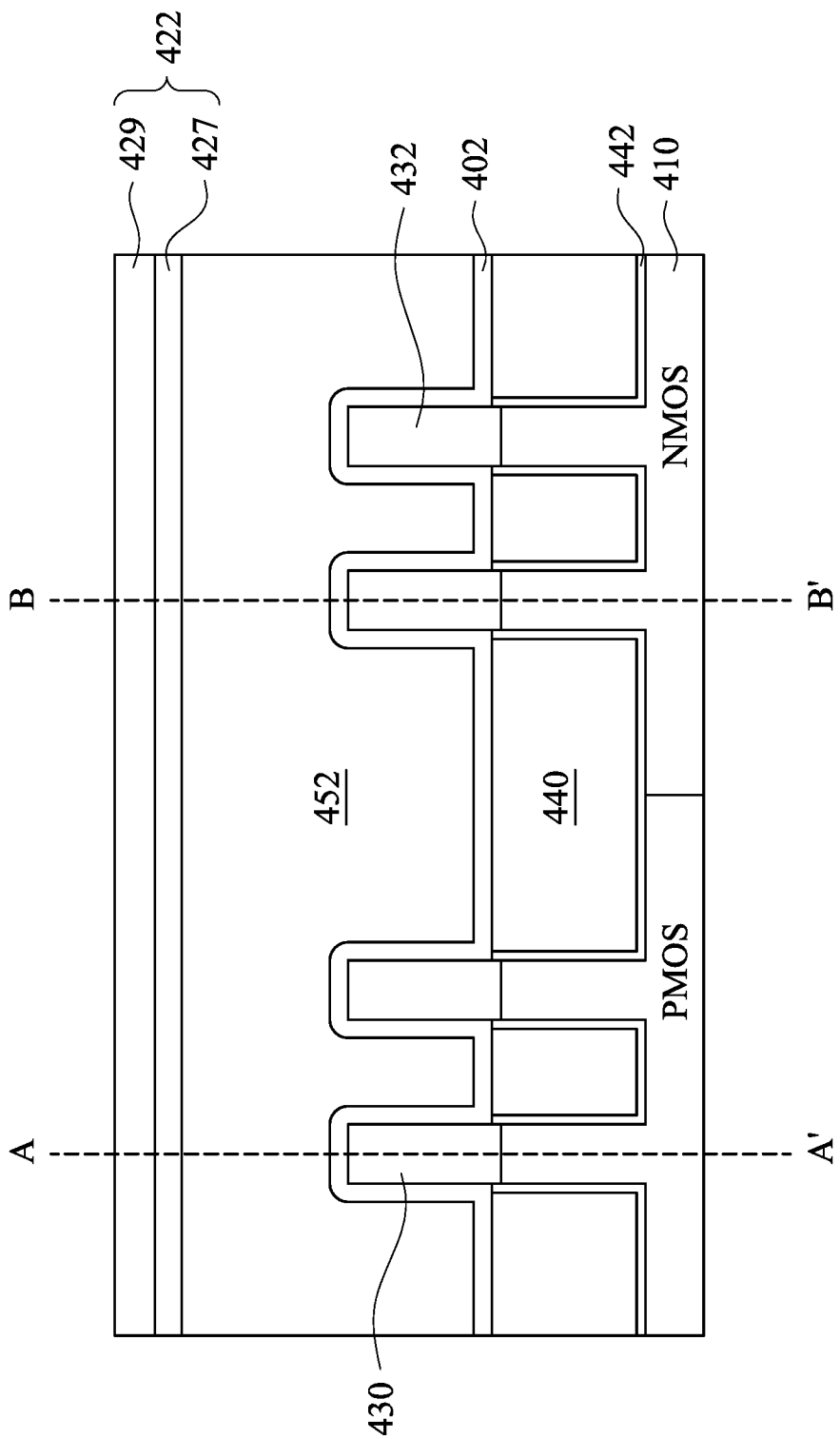
Figure 4G:
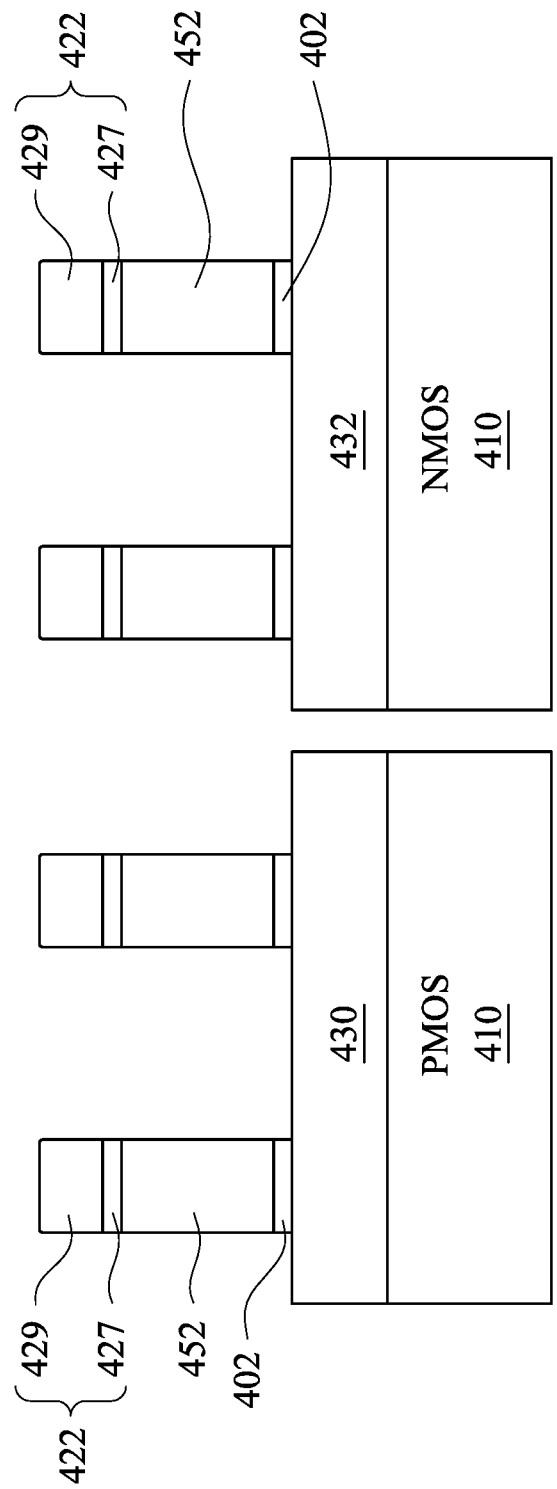
Figure 4H:
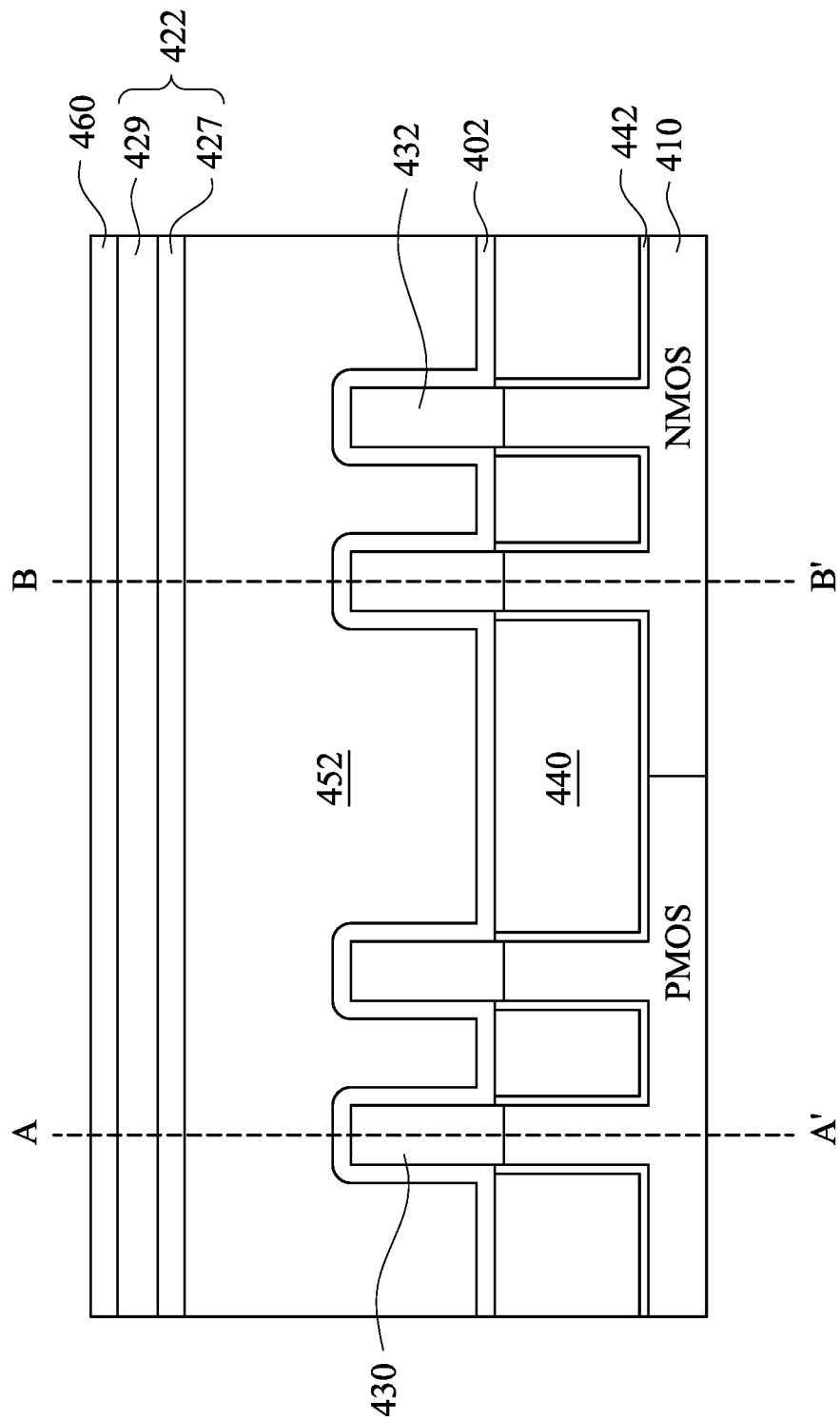
Figure 4I:
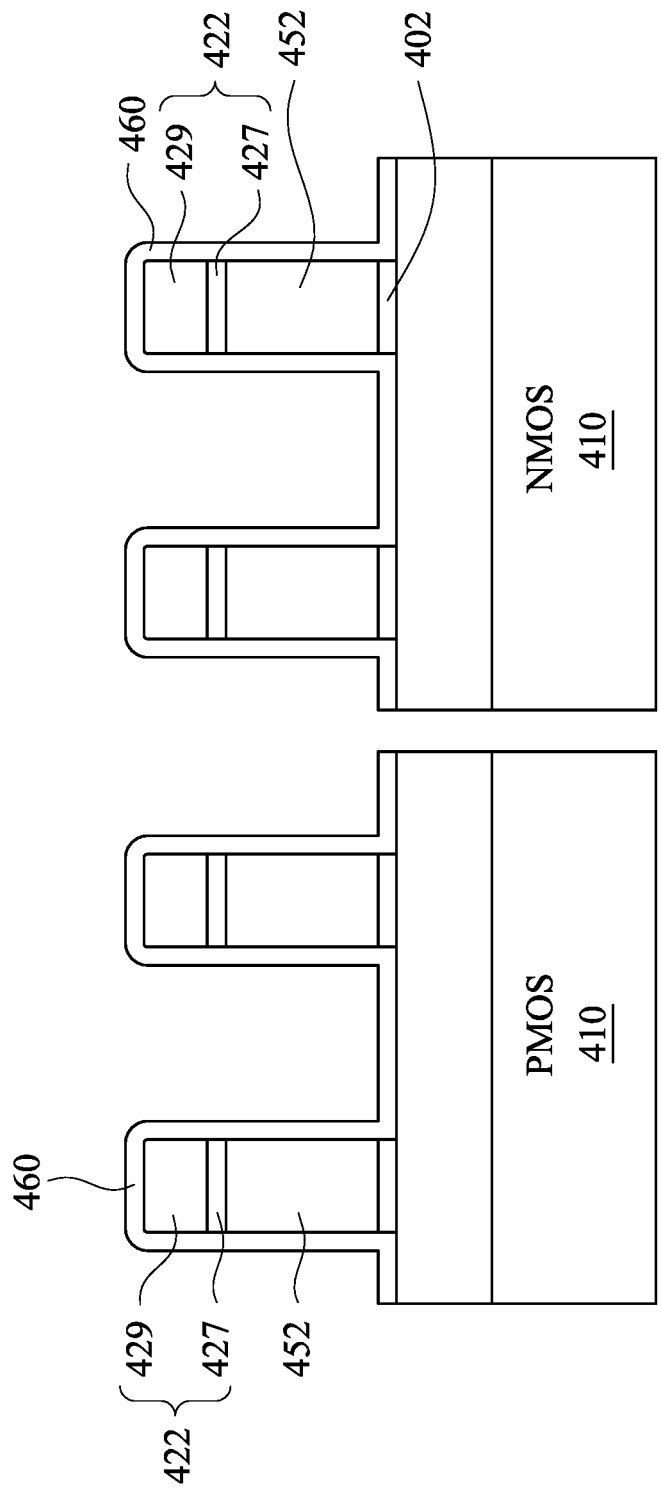
Figure 4J:
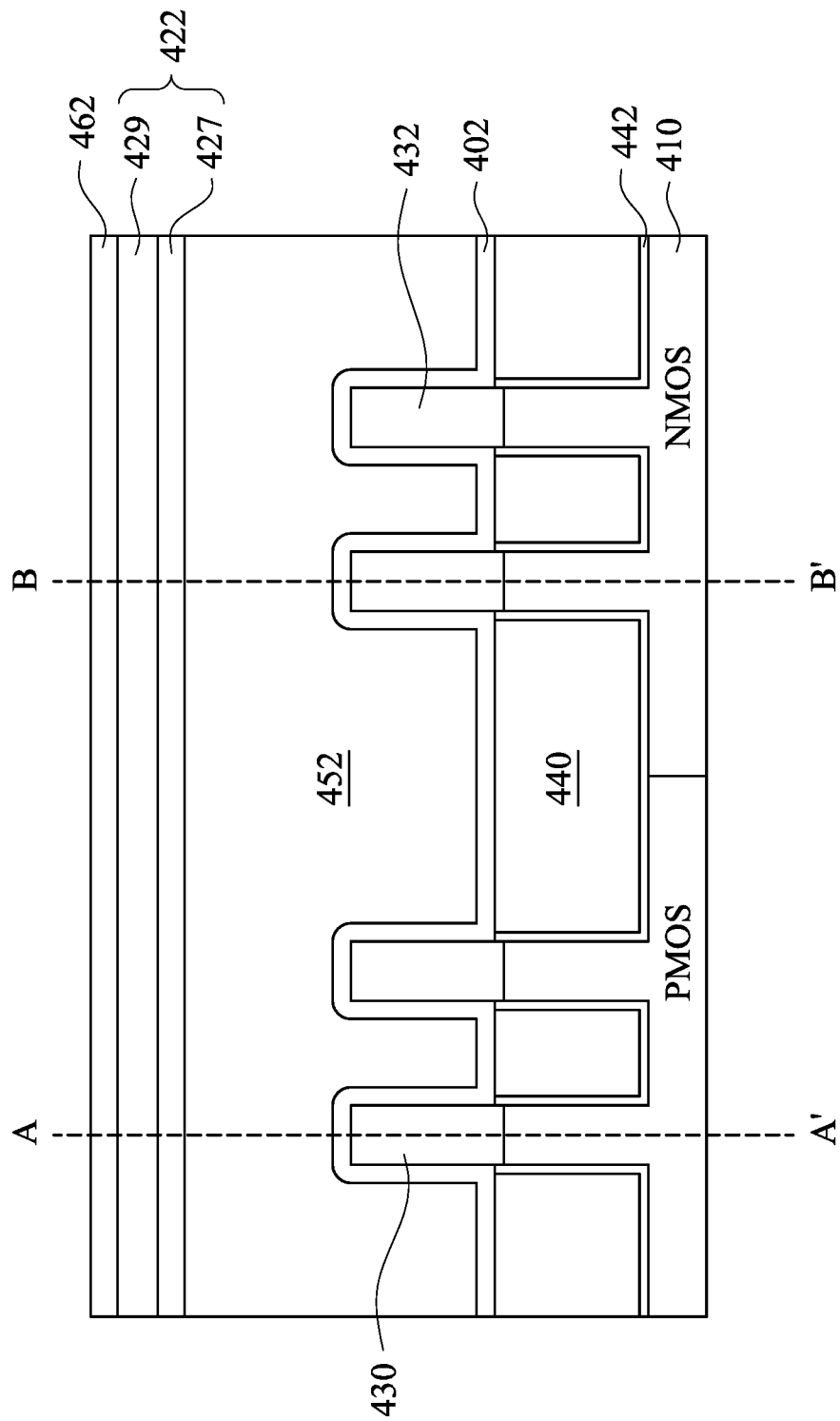
Figure 4K:
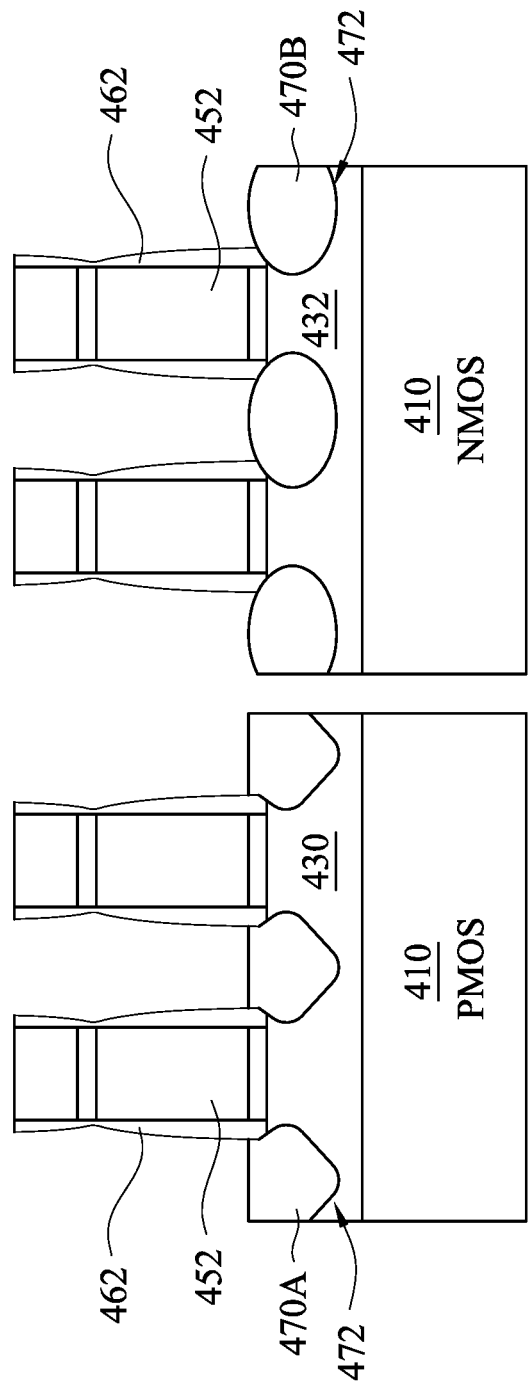
Figure 4L:
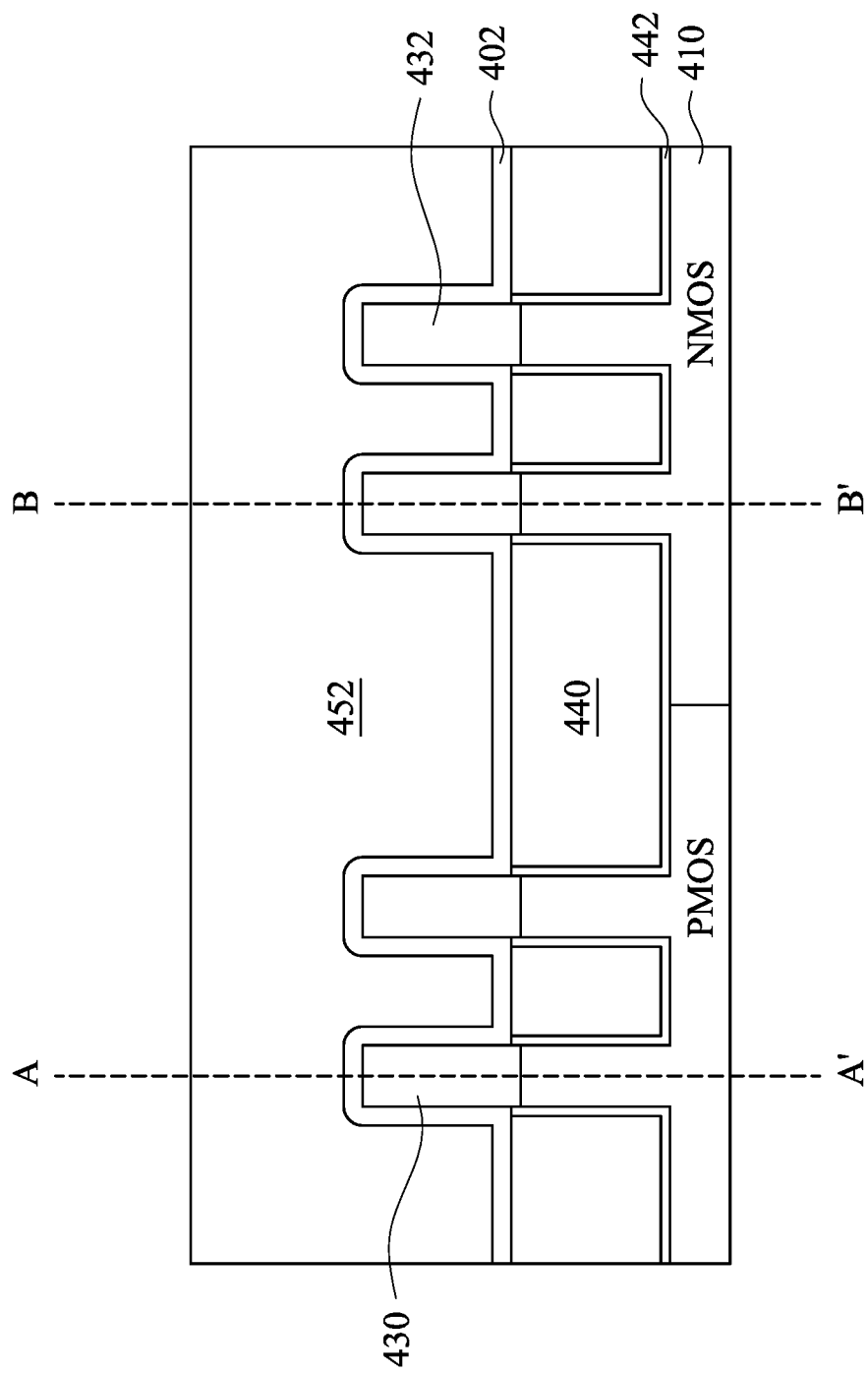
Figure 4M:
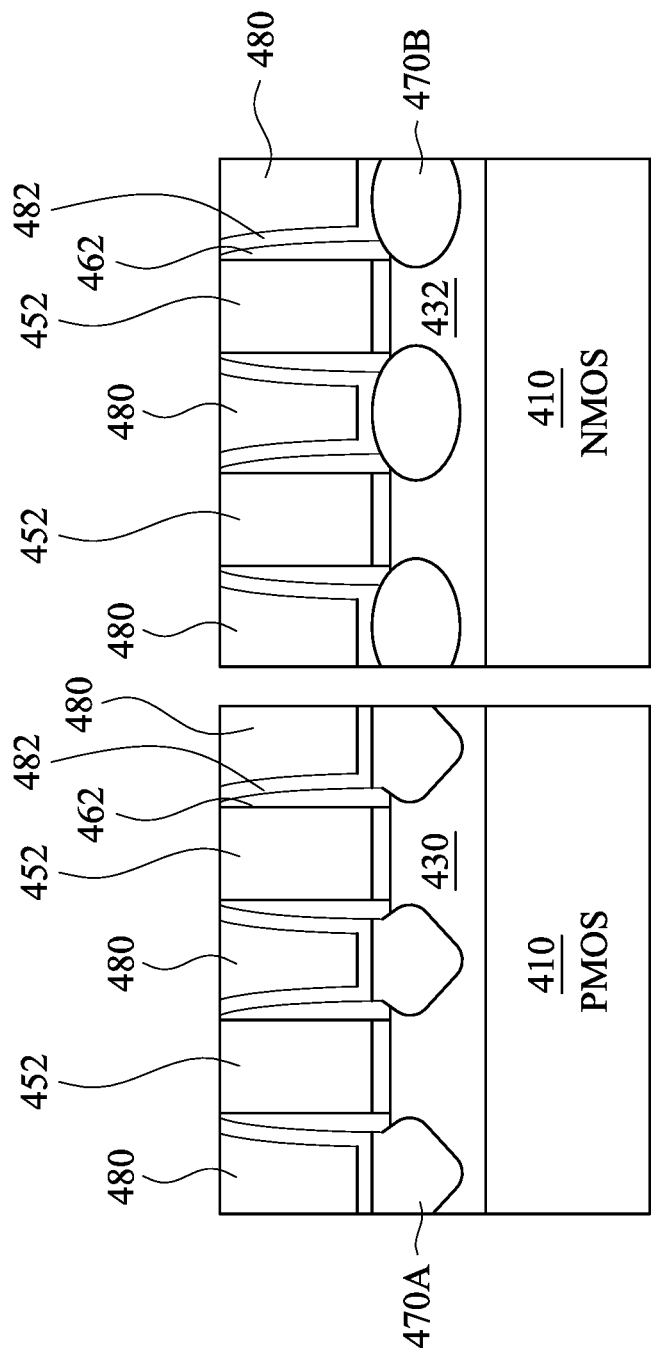
Figure 4N:
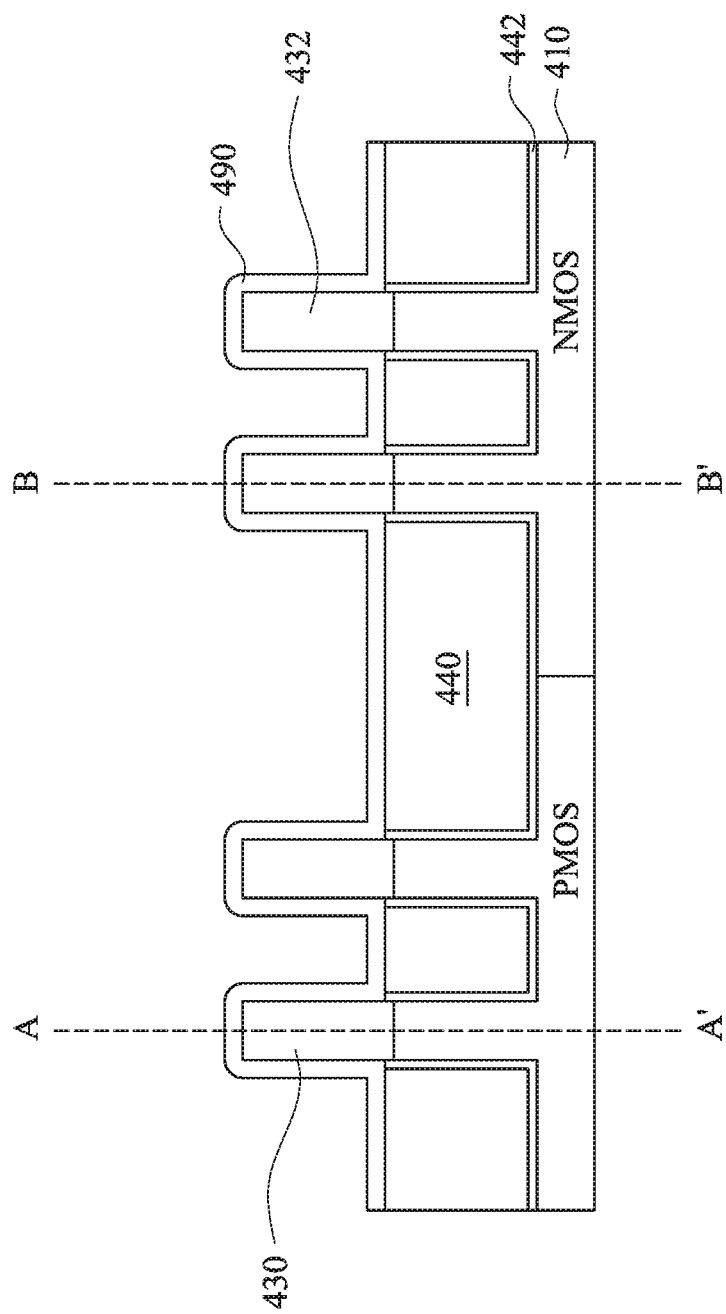
FIG. 4N' to FIG. 4S' are schematic cross-sectional views of intermediate stages showing a method for forming a nanolaminate structure in accordance with another embodiment of the present disclosure, in which FIG. 4O', FIG. 4Q' and FIG. 4S' are schematic cross-sectional views cut from the section line A-A' of the PMOS and the sectional line B-B' of the NMOS of FIG. 4N', FIG. 4P' and FIG. 4R'.
Figure 4O:
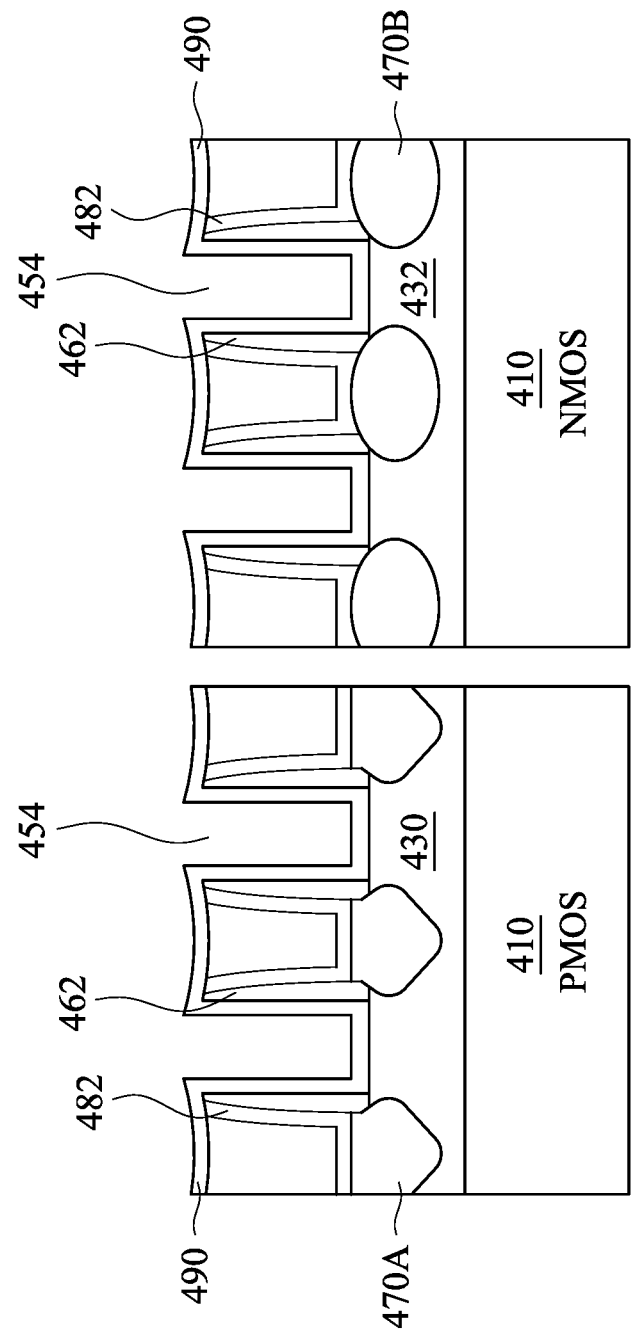
Figure 4P:
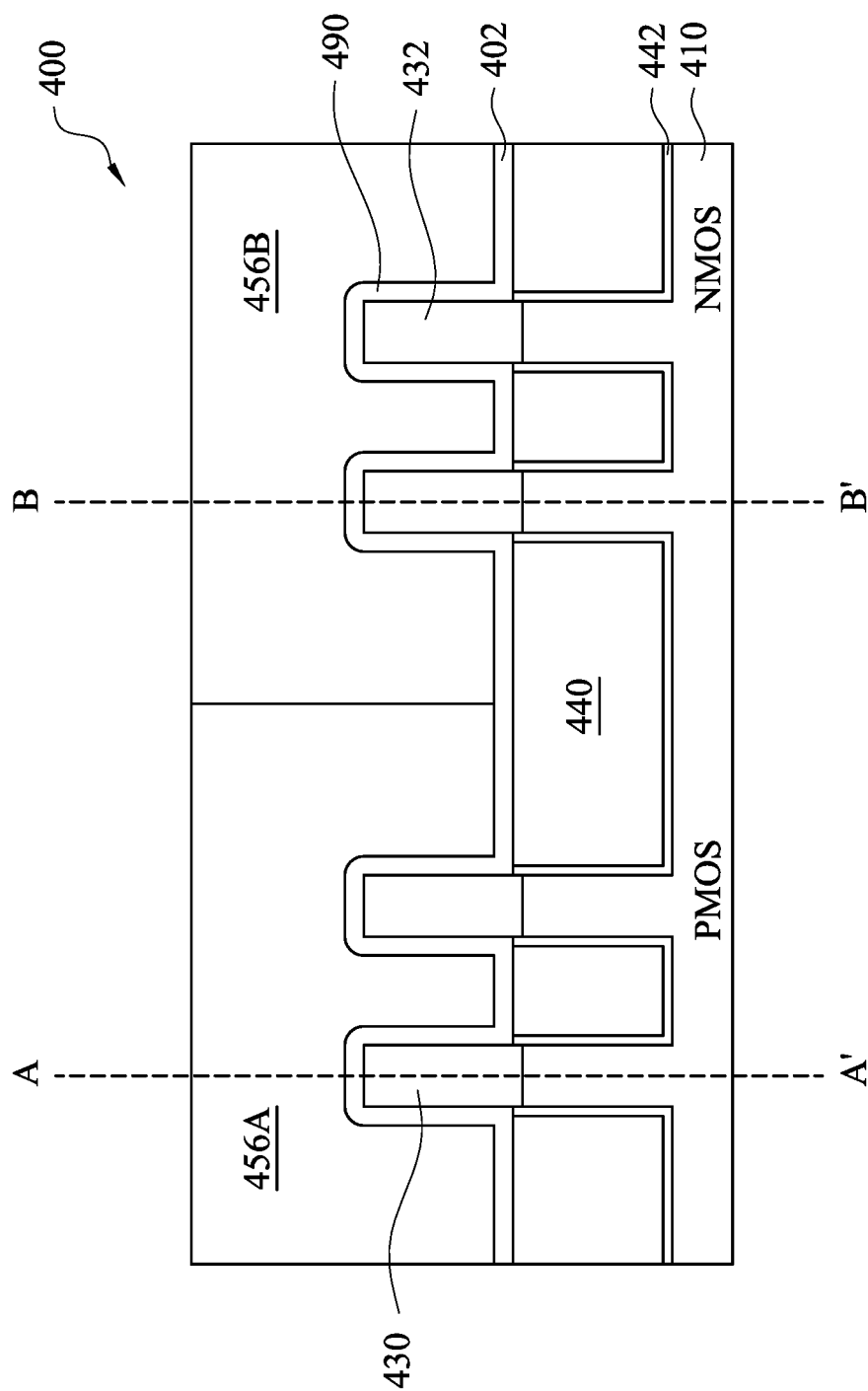
Figure 4Q:
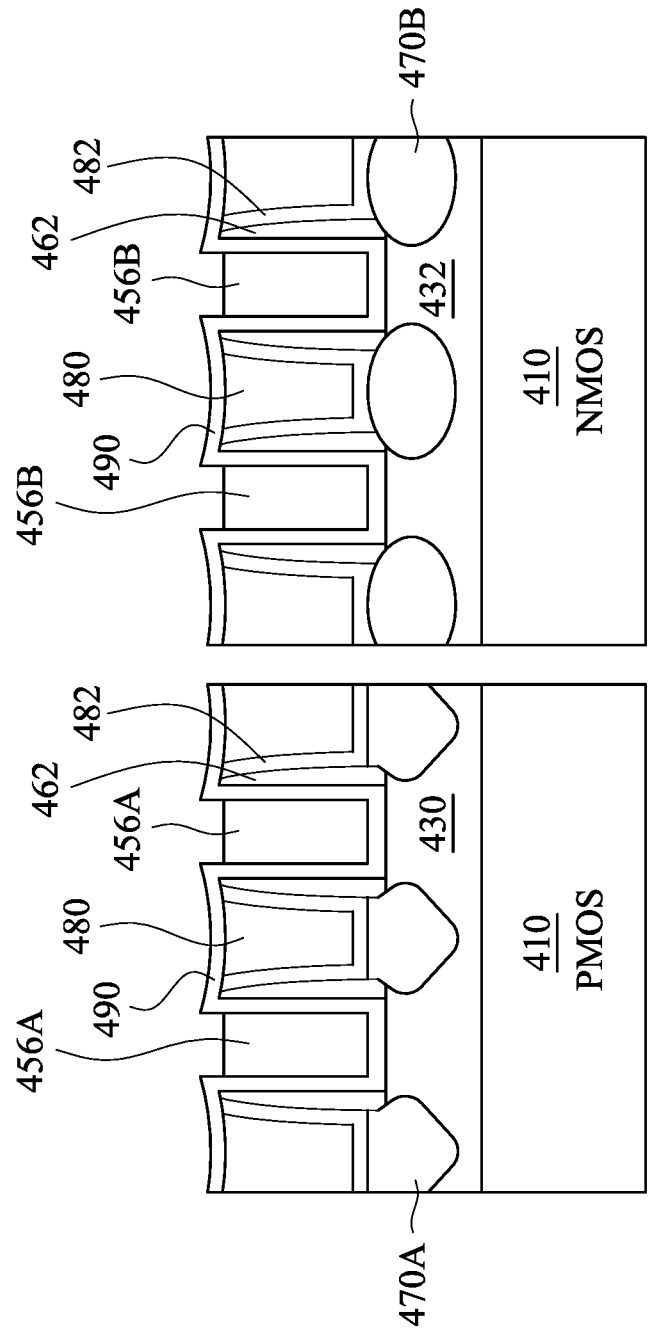
Figure 4N:
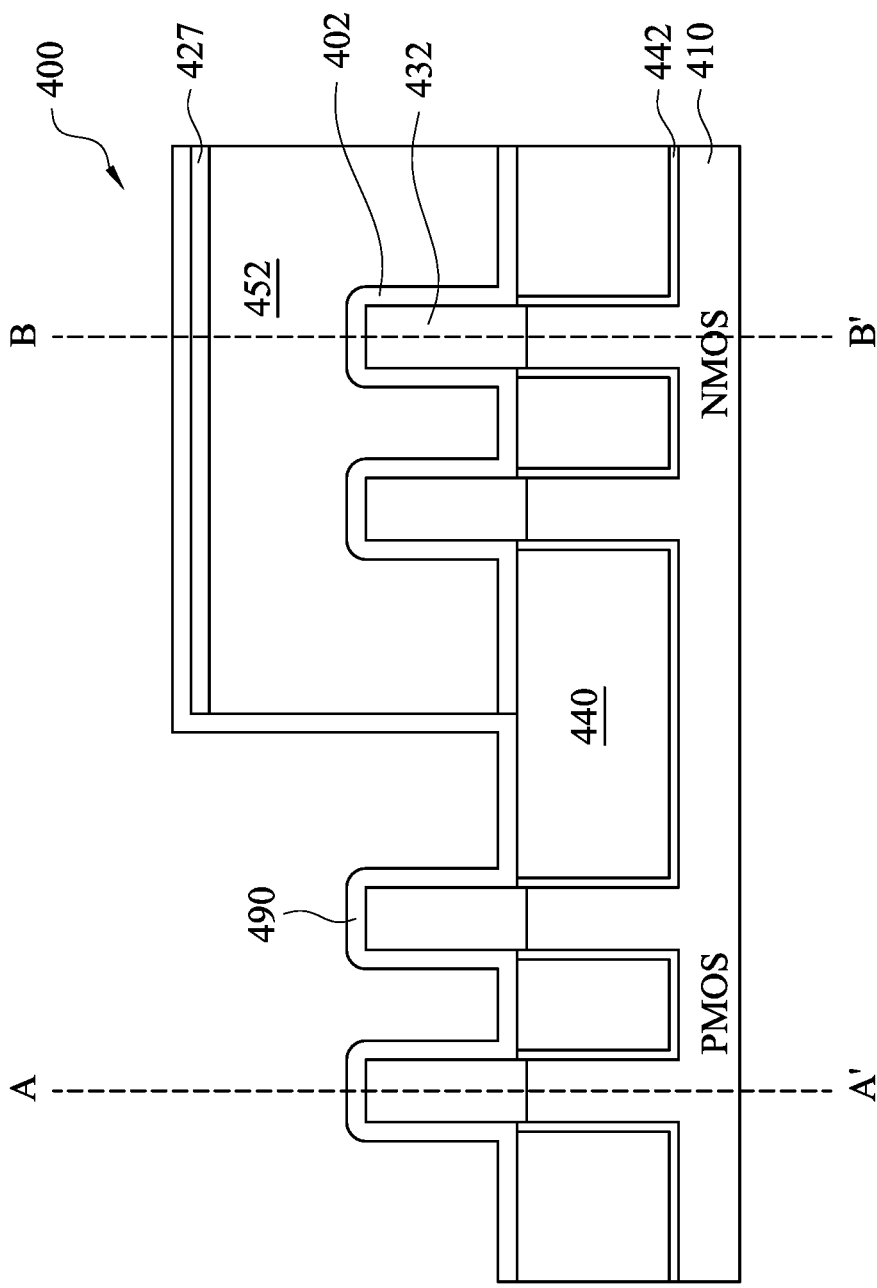
Figure 4O:
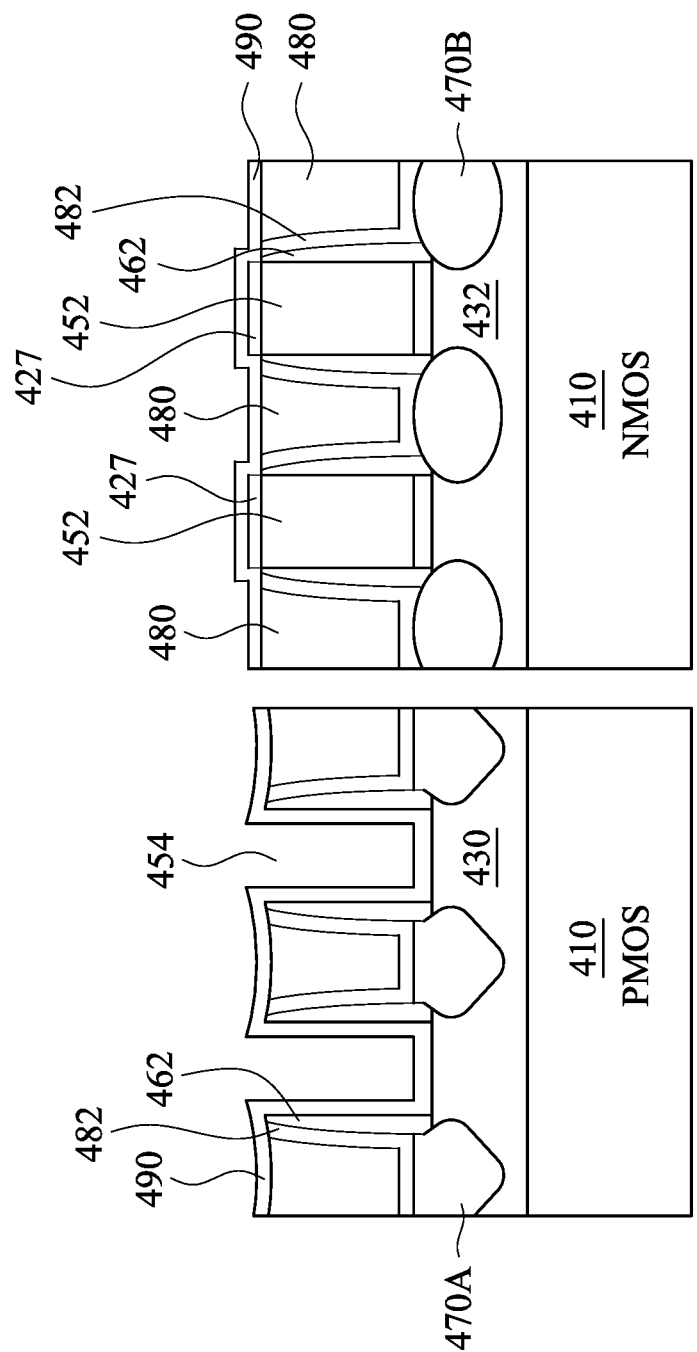
Figure 4P:
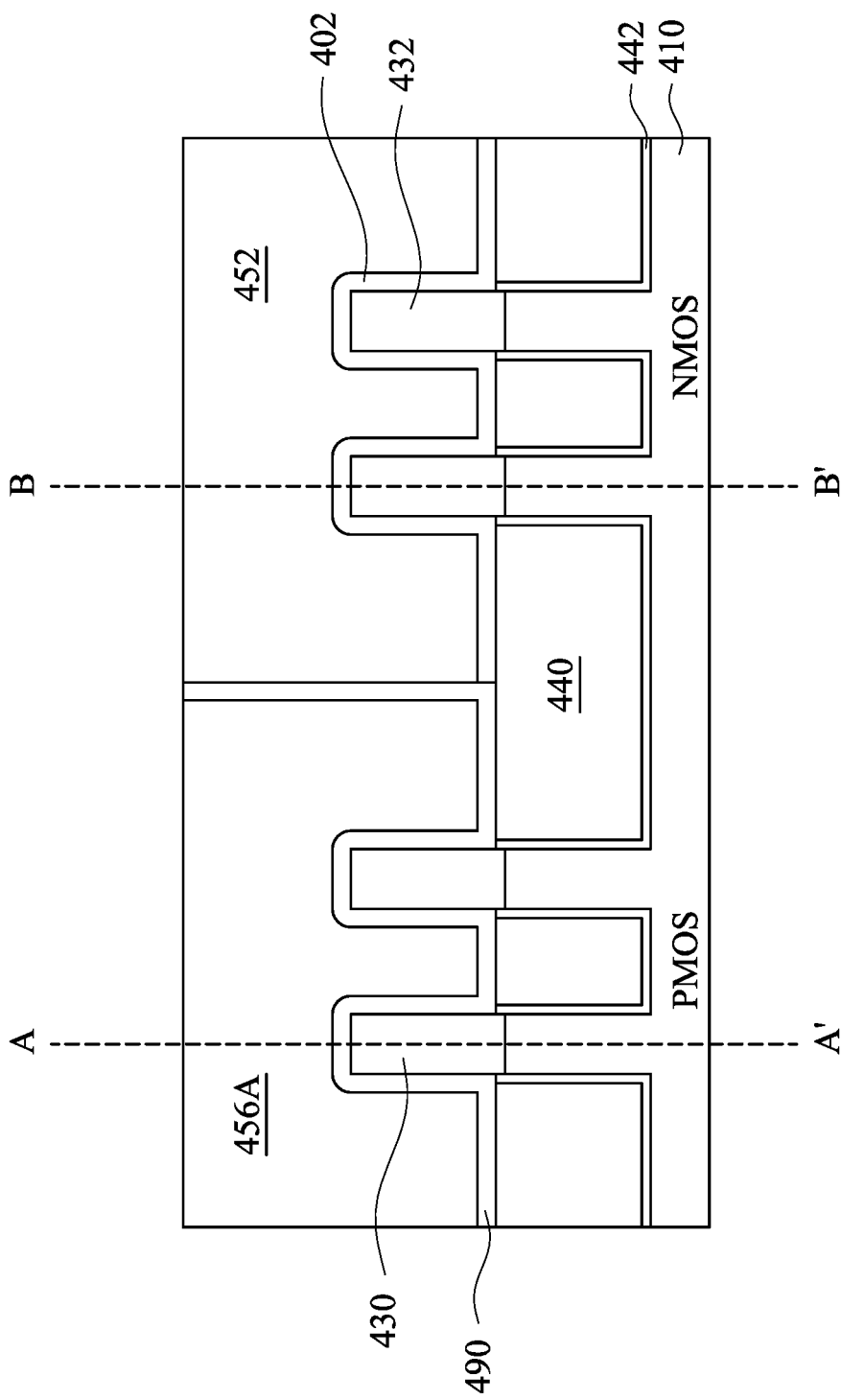
Figure 4Q:
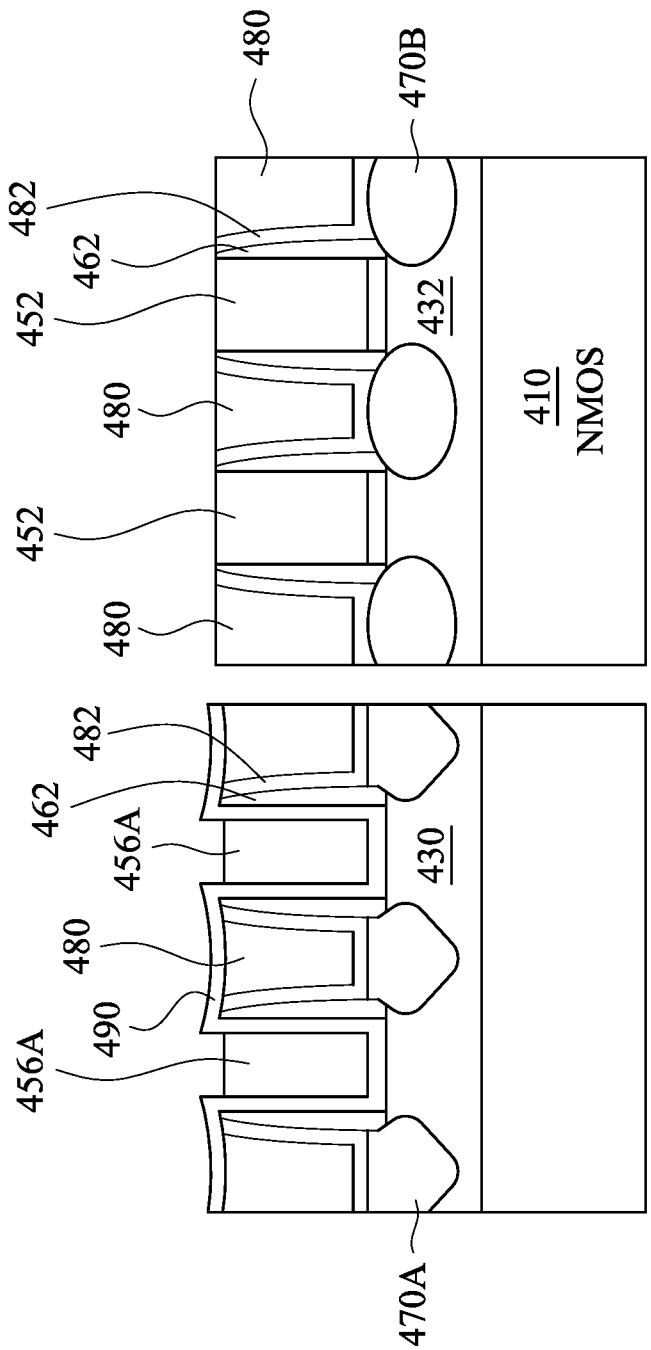

FIG. 4A to FIG. 4Q illustrate schematic cross-sectional views of intermediate stages showing a method for forming a nanolaminate structure in accordance with various embodiments of the present disclosure, in which FIG. 4G, FIG. 4I, FIG. 4K, FIG. 4M, FIG. 4O, and FIG. 4Q are schematic cross-sectional views cut from the section line A-A' of the PMOS and the sectional line B-B' of the NMOS of FIG. 4F, FIG. 4H, FIG. 4J, FIG. 4L, FIG. 4N and FIG. 4P.

In FIG. 4A, a semiconductor substrate 410 is provided. In some embodiments, the semiconductor substrate 410 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 410. Alternatively, the silicon substrate may be an active layer of a semiconductor-on-insulator (SOI) substrate or a multi-layered structure such as a silicon-germanium layer formed on a bulk silicon layer. In some embodiments, the semiconductor substrate 410 may include various doped regions depending on design requirements as known in the art. The doped regions may be doped with p-type dopants, such as boron or $BF_2$; n-type dopants, such as phosphorus or arsenic; or combinations thereof. The doped regions may be formed directly on the semiconductor substrate 410, in a P-well structure, in an N-well structure, in a dual-well structure, or using a raised structure. The semiconductor substrate 410 may further include various active regions, such as regions configured for an N-type metal-oxide-semiconductor device and regions configured for a P-type metal-oxide-semiconductor device. The active region may be formed by epitaxially growing a layer including, for example, SiGe over the semiconductor substrate 410, followed by a chemical polish process. In one embodiment, a first active region 412 is located above the N well of the semiconductor substrate 410, in which the first active region 412 may include, for example, SiGe. In other embodiments, a second active region 414 is located above the P well of the semiconductor substrate 410, in which the second active region 414 may include, for example, Si. In a further embodiment, the second active region 414 may cover the first active region 412 may, thereby forming a Si cap on the first active region 412.

In FIG. 4B, a first hardmask layer 420 is formed on the semiconductor substrate 410, in which the first hardmask layer 420 may include silicon oxide, silicon nitride, silicon oxynitride, or any other suitable dielectric material. In some embodiments, the hardmask layer 420 includes a first oxide layer 421 on the semiconductor substrate 410, a nitride layer 423 on the first oxide layer 421, and a second oxide layer 425 on the nitride layer 423. The first hard mask layer 420 may be formed by thermal oxidation, chemical oxidation, atomic layer deposition (ALD), or any other proper method.

In FIG. 4C, first fins 430 and second fins 432 are respectively formed over the semiconductor substrate 410 by using the first hardmask layer 420, in which a portion of the Si cap is remained on the first fin 430. The first fins 430 and the second fins 432 are formed by any suitable process including various deposition, photolithography, and/or etching processes. As an example, the first fins 430 and the second fins 432 are formed by respectively patterning and etching the active region 412 and the active region 414 of the semiconductor substrate 410, thereby forming the first fins 430 including germanium and the second fins 432 including silicon. In another example, the first fins 430 and the second fins 432 are formed by patterning and etching a silicon layer deposited overlying an insulator layer (for example, an upper silicon layer of a silicon-insulator-silicon stack of an SOI substrate. In some embodiments, only one first fin is formed on the first active region 412, and only one second fin is formed on the second active region 414. However, numbers of the first fin and the second fin are not limited to the embodiments of the present disclosure.

As shown in FIG. 4D, forming an isolation structure 440 in or on the semiconductor substrate 410, followed by removing the first hardmask layer 420, the Si cap on each of the first fins 430, and a portion of the second fins 432. In some embodiments, forming the isolation structure 440 includes forming a liner oxide layer 442 in or on the semiconductor substrate 410. In some embodiments, the liner layer 442 may be formed by using a deposition technique that can form conformal oxide layers, such as selective area chemical vapor deposition (SACVD) processes and the likes. The isolation structure 440 may be formed using traditional isolation technology, such as shallow trench isolation (STI), to define and electrically isolate the various regions. As one example, the formation of an STI includes a photolithography process, etching a trench in the semiconductor substrate 410, filling the trench (for example, by using a chemical vapor deposition process) with one or more dielectric layers. The dielectric material includes silicon oxide, silicon nitride, silicon oxynitride, or other suitable materials, or combinations thereof. Additionally, a chemical mechanical polishing (CMP) process is performed to remove excessive dielectric layer and planarize the top surface of the isolation structure 440 with the top surfaces of the first fins 430 and the second fins 432. Additionally, the CMP process removes the first hard mask 420 as well. Furthermore, a dry etching process may be performed to remove a portion of the isolation structure 440, and the first fins 430 and the second fins 432 protrude from the isolation structure 440.

In FIG. 4E, a gate oxide layer 402 is formed on the first fins 430, the second fins 432 and the isolation structure 440. In some embodiments, the gate oxide layer 402 may include silicon oxide, silicon nitride or silicon oxynitride. In some embodiments, a deposition process (e.g. CVD, physical vapor deposition (PVD), PECVD, ALD, etc.), may be applied to form the gate oxide layer 402. Then, a polysilicon layer 450 is formed on the gate oxide layer 402 by, for example, a deposition processes including CVD, PVD, ALD, other suitable methods, and/or combinations thereof.

FIG. 4F and FIG. 4G illustrate schematic cross-sectional views of the same intermediate stage for forming the nanolaminate structure, in which the cross-sectional views of FIG. 4G are respective cut from the sectional line A-A' of the PMOS and the sectional line B-B' of the NMOS. In FIG. 4F and FIG. 4G, a second hardmask layer 422 is formed on the polysilicon layer 450, and the polysilicon layer 450 is patterned to form dummy gates 452. The dummy gate 452 has a first portion extending across the SiGe fin 430 within the PMOS region (i.e., N-well region), and a second portion extending across the silicon fin 432 within the NMOS region (i.e., P-well region). The second hardmask layer 422 may include a similar material as the first hardmask layer 420. For example, the second hardmask layer 422 may include a silicon nitride layer 427 and an oxide layer 429.

In FIG. 4H and FIG. 4I, a spacer layer 460 is formed on the dummy gates 452 over the semiconductor substrate 410. In some embodiments, the spacer layer 460 may include a dielectric material such as silicon oxide, silicon nitride, silicon carbide, silicon oxynitride, or combinations thereof. The spacer layer 460 may include a multiple layers. Typical formation methods for the spacer layer 460 include depositing a dielectric material over the dummy gates 452.

In FIG. 4J and FIG. 4K, spacers 462 on a sidewall of the dummy gates 452 are formed, followed by the formation of source/drain structures 470A and 470B. In some embodiments, the spacers 462 may be formed by anisotropically etching back the dielectric material of the spacer layer 460. The etching back process may include a multiple-step etching to gain etch selectivity, flexibility and desired overetch control. In some embodiments, plural recesses 472 are formed on either side of the dummy gates 452 in the first active region 412 and the second active region 414 by an etching process, followed by epitaxially growing a semiconductor material in the recesses 472 to form the source/ drain structures 470A and 470B. The semiconductor material includes Ge, Si, GaAs, AlGaAs, SiGe, GaAsP, or other suitable material. The common source/drain structures may be formed by one or more epitaxy or epitaxial (epi) processes. The source/drain structures 470A and 470B may be in-situ doped during the epi process. For example, the epitaxially grown SiGe source/drain structure 470A may be doped with boron; and the epitaxially grown Si epi source/drain structure 470B may be doped with carbon to form Si:C source/drain structures, phosphorous to form Si:P source/drain structures, or both carbon and phosphorous to form SiCP source/drain structures. In one embodiment, the source/drain structures 470A and 470B are not in-situ doped, an implantation process (i.e., a junction implant process) is performed to dope the source/drain structures 470A and 470B.

In FIG. 4L and FIG. 4M, the second hardmask layer 422 and a portion of the spacer 462 are removed, followed by forming an interlayer dielectric (ILD) layer 480 on each side of each dummy gate 452 over the semiconductor substrate 410. In some embodiments, a contact edge stop layer (CESL) 482 may be formed on a sidewall of each dummy gate 452 prior to forming the ILD layer 480. The ILD layer 480 includes silicon oxide, oxynitride or other suitable materials. The ILD layer 480 includes a single layer or multiple layers. The ILD layer 480 is formed by a suitable technique, such as CVD, ALD and spin-on (SOG). A chemical mechanical polishing (CMP) process may be performed to remove excessive ILD layer 480 and planarize the top surface of the ILD layer 480 with the top surface of the dummy gates 452.

Figure 4R:
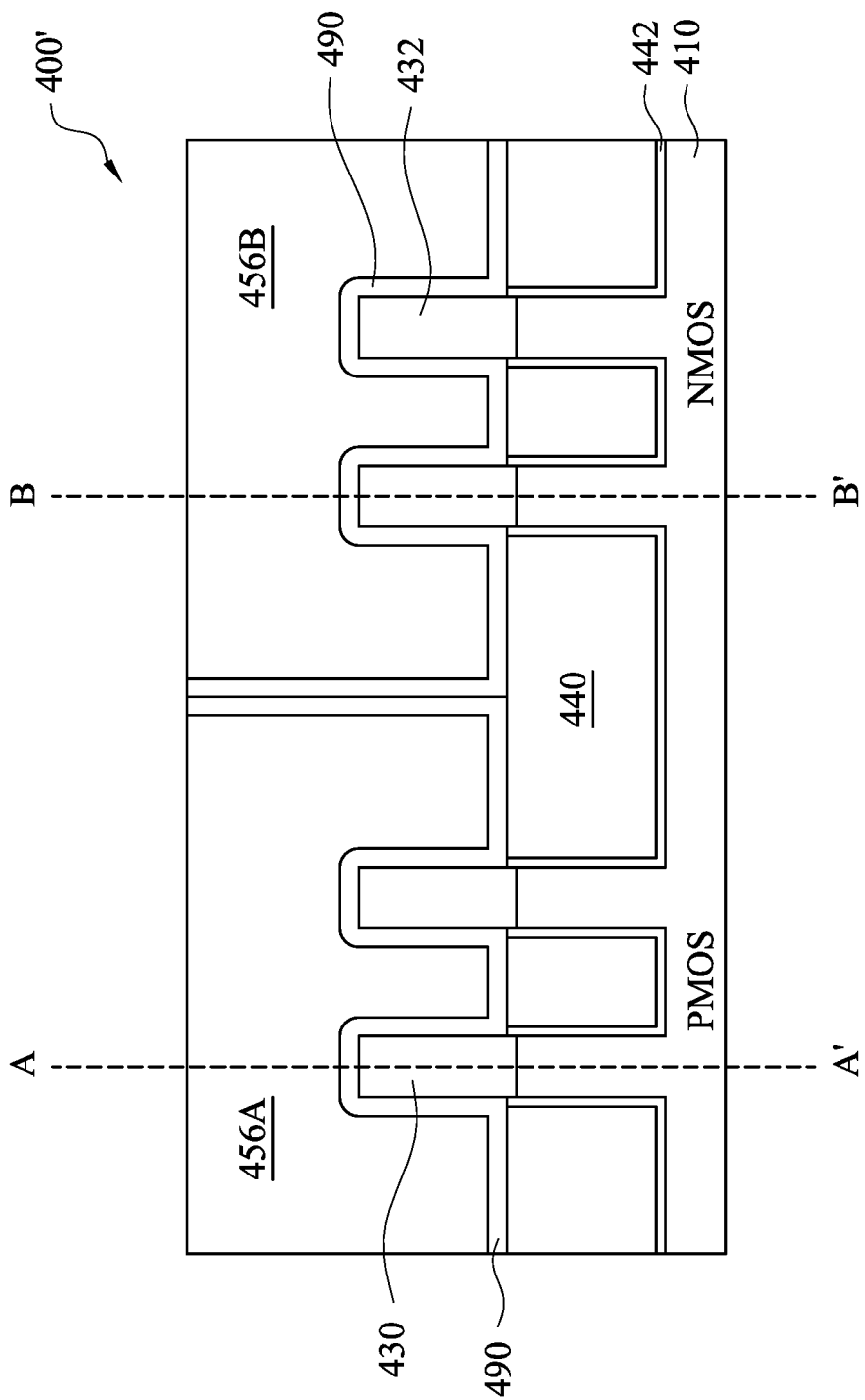
FIG. 4R is a schematic cross-sectional view of the nanolaminate structure 490 of FIG. 4N and FIG. 4O.

Referring to FIG. 4N, FIG. 4O and FIG. 4R, in which FIG. 4R is a schematic cross sectional view of a nanolaminate structure 490 of FIG. 4N and FIG. 4O. In FIG. 4N and FIG. 4O, the dummy gates 452 and the gate oxide layer 402 on the first fins 430 and the second fins 432 are removed to form a gate trench 454, and a nanolaminate structure 490 is formed on the first fins 430 and the second fins 432 over the semiconductor substrate 410. In some embodiments, the dummy gates 452 and the gate oxide layer 402 are removed by an etching process, such as selective wet etch or selective dry etch. In some embodiments, the nanolaminate structure 490 is formed by performing a pre-treatment on the first fins 430 and/or the second fin 432, depositing a first metal oxide layer 492 on the first fins 430 and/or the second fin 432, and alternately stacking at least one second metal oxide layer 494 and at least one third metal oxide layer 496 on the first metal oxide layer 492. In some embodiments, a pre-pulse operation is performed between the pre-treatment and depositing the first metal oxide layer 492, and/or performed prior to stacking the at least one third metal oxide layer 496 over the second metal oxide layer 494. It is noted that the pre-treatment on the semiconductor substrate 410, the pre-pulse operation, and the formation of the first metal oxide layer 492, the at least one second metal oxide layer 494 and the at least one third metal oxide layer 496 are similar to the pre-treatment on the semiconductor substrate 310, the pre-pulse operation, and the formation of the first metal oxide layer 320, the at least one second metal oxide layer 332 and the at least one third metal oxide layer 334. In some embodiments, the nanolaminate structure 490 may have an arrangement similar to the nanolaminate structure 300 shown in FIG. 3C and FIG. 3D.

In FIG. 4P and FIG. 4Q, metal gate layers 456A and 456B are formed in the trench 454, thereby forming a FinFET device 400 having the nanolaminate structure 490. In some embodiments, the metal gate layer 456A on the first fins 430 include a material suitable for a p-type semiconductor device, and the metal gate layer 456B on the second fin 432 include a material suitable for a n-type semiconductor device. In some embodiments, the metal gate (MG) layer may include a single layer or multi layers, such as metal layer, liner layer, wetting layer, and adhesion layer. For example, the MG layer may include Ti, Ag, Al, TiAlN, TaC, TaCN, TaSiN, Mn, Zr, TiN, TaN, Ru, Mo, Al, WN, Cu, W, or any suitable materials. The MG layers 456A and 456B may be formed by ALD, PVD, CVD, or other suitable process. A CMP may be performed to remove excessive MG layers 456A and 456B.

Figure 4S:
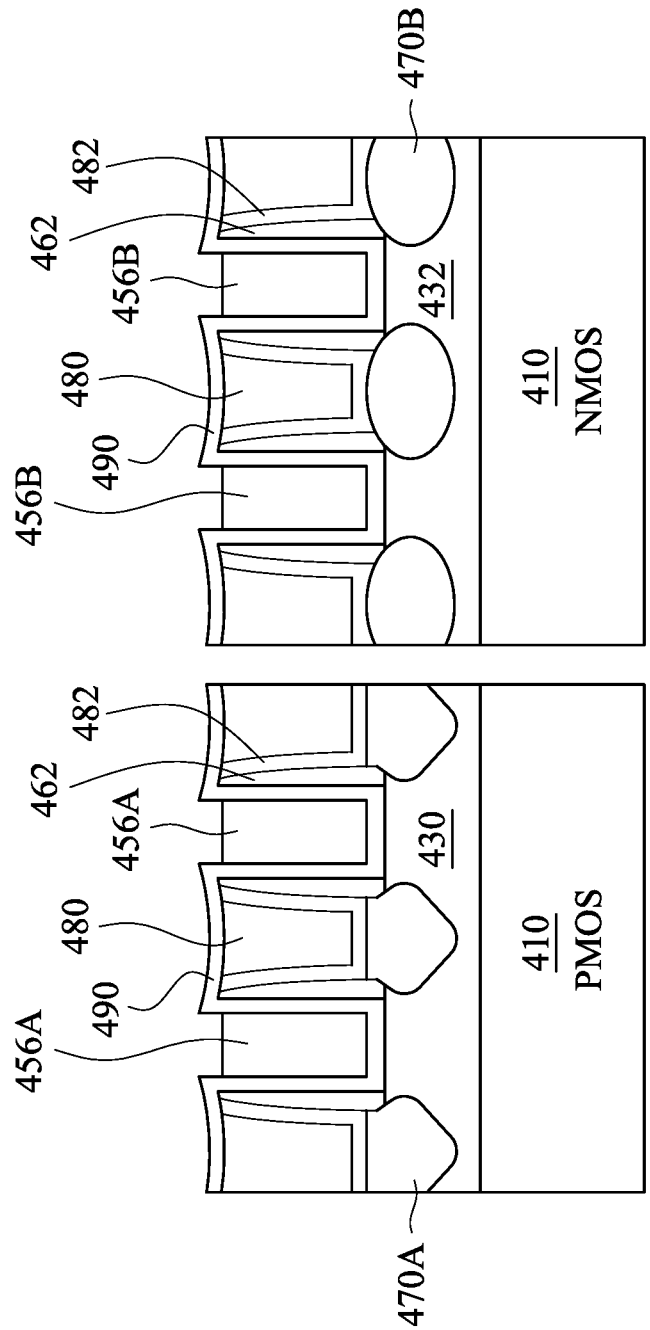

In some embodiments, the operation of FIG. 4N to FIG. 4Q may be performed as shown in FIG. 4N' to FIG. 4S'. That is, the dummy gates 452 and the gate oxide layer 402 on the first fins 430 are removed while the dummy gates 452 and the gate oxide layer 402 on the second fin 432 are remained, as shown in FIG. 4N' and FIG. 4O'. Next, the nanolaminate structure 490 is formed on the first fins 430 over the semiconductor substrate 410, and also formed on the dummy gates 452 on the second fin 432. As illustrated in FIG. 4N', the nanolaminate structure 490, which includes the first metal oxide layer (e.g., Al$_2$O$_3$ layer) 492, alternatingly stacked the second and third metal oxide layers (e.g., alternatingly stacked HfO$_2$ and Al$_2$O$_3$ layers) 494 and 496 as illustrated in FIG. 4R, has a first portion extending within the PMOS region (i.e., N-well region) and across the SiGe fin 430 to contact an end surface of the gate oxide 402 under the second portion of the dummy gate 452 within the NMOS region (i.e., P-well region). Moreover, as illustrated in FIG. 4N', the nanolaminate structure 490 further includes a second portion (i.e., vertical portion) extending upwardly and vertically from the first portion of the nanolaminate structure 490 along and in contact with a sidewall of the second portion of the dummy gate 452 to a position higher than a topmost position of the first portion of the nanolaminate structure 490. The nanolaminate structure 490 further includes a third portion that laterally extends from the second portion along the top surface of the silicon nitride layer 427 and thus extends over the second portion of the dummy gate 452. In some embodiments, the silicon nitride layer 427 of the second hardmask layer 422 on the second fin 432 is also remained. Then, the metal gate layer 456A is formed in the trench 454 on the first fins 430, in which the metal gate layer 456A on the first fins 430 include a material suitable for a p-type semiconductor device, as shown in FIG. 4P' and FIG. 4Q'.

In FIG. 4P', FIG. 4R' and FIG. 4S', the nanolaminate structure 490 over the dummy gate 452, the dummy gates 452, the gate oxide layer 402 and the silicon nitride layer 427 above the second fin 432 are removed, thereby forming the trench 454 on the second fin 432. As illustrated in FIG. 4P', a portion of the nanolaminate structure 490 is removed from above the second portion of the dummy gate 452 within the NMOS region, while leaving a vertical portion of the nanolaminate structure 490 in contact with the sidewall of the second portion of the dummy gate 452. Then, as shown in FIG. 4R' and FIG. 4S', another nanolaminate structure 490 is formed on the second fin 432, and the metal gate layer 456B is formed in the trench 454 on the second fin 432, thereby forming a FinFET semiconductor device 400', in which the metal gate layer 456B on the second fin 432 includes a material suitable for a n-type semiconductor device. Stated differently, the second portion of the dummy gate 452 is replaced with the metal gate layer 456B, as illustrated in FIG. 4P' and FIG. 4R'. As illustrated in FIG. 4R', the nanolaminate structure 490 within the NMOS region has a vertical portion extending vertically and in contact with a sidewall of the vertical portion of the nanolaminate structure 490 within the PMOS region. Moreover, the vertical portion of the nanolaminate structure 490 within the NMOS region has a same height as the vertical portion of the nanolaminate structure 490 within the PMOS region. The topmost end of the vertical portion of the nanolaminate structure 490 within the NMOS region is substantially level with the topmost end of the vertical portion of the nanolaminate structure 490 within the PMOS region.

The FinFET device 400 may undergo further CMOS or MOS technology processing to form various features and regions known in the art. For example, subsequent processing may form various contacts/vias/lines and multilayers interconnect features (e.g., metal layers and interlayer dielectrics) over the semiconductor substrate 410, configured to connect the various features or structures of the FinFET device 400. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multi-layer interconnection structure.

Figure 5:
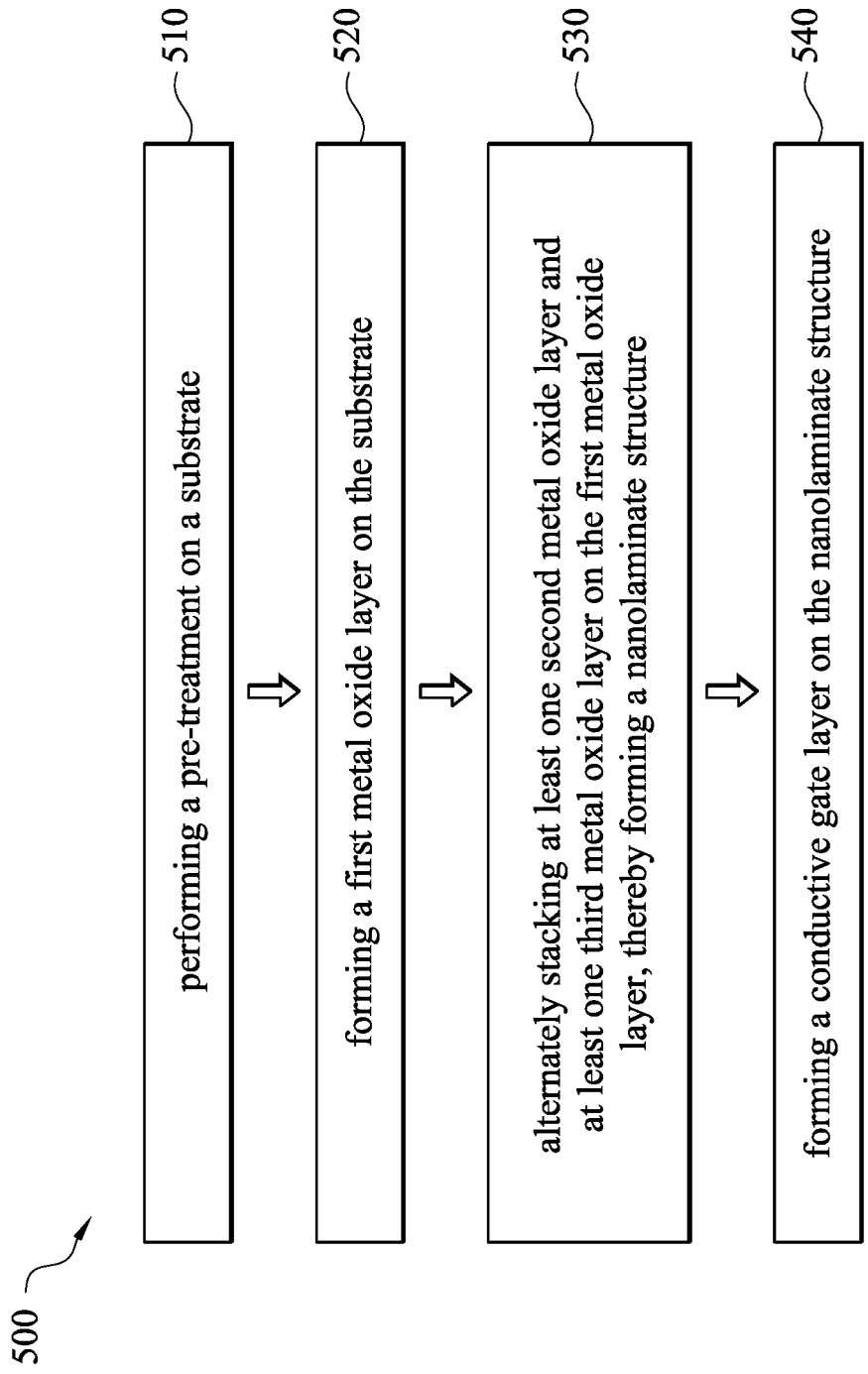
FIG. 5 is a flow chart of a method of forming a nanolaminate structure in accordance with various embodiments of the present disclosure.

FIG. 5 illustrates a flow chart of a method 500 of forming a nanolaminate structure in accordance with various embodiments of the present disclosure. The method 500 is described in relation to FIG. 3A to FIG. 3E. At operation 510, a pre-treatment is performed on a semiconductor substrate, as shown in FIG. 3A. At operation 520, a first metal oxide layer is formed on the semiconductor substrate, as shown in FIG. 3B. And at operation 530, at least one second metal oxide layer and at least one third metal oxide layer are alternately stacked on the first metal oxide layer, thereby forming the nanolaminate structure, as shown in FIGS. 3C and 3D. At operation 540, a conductive gate layer is formed on the nanolaminate structure, as shown in FIG. 3E.

Figure 6:
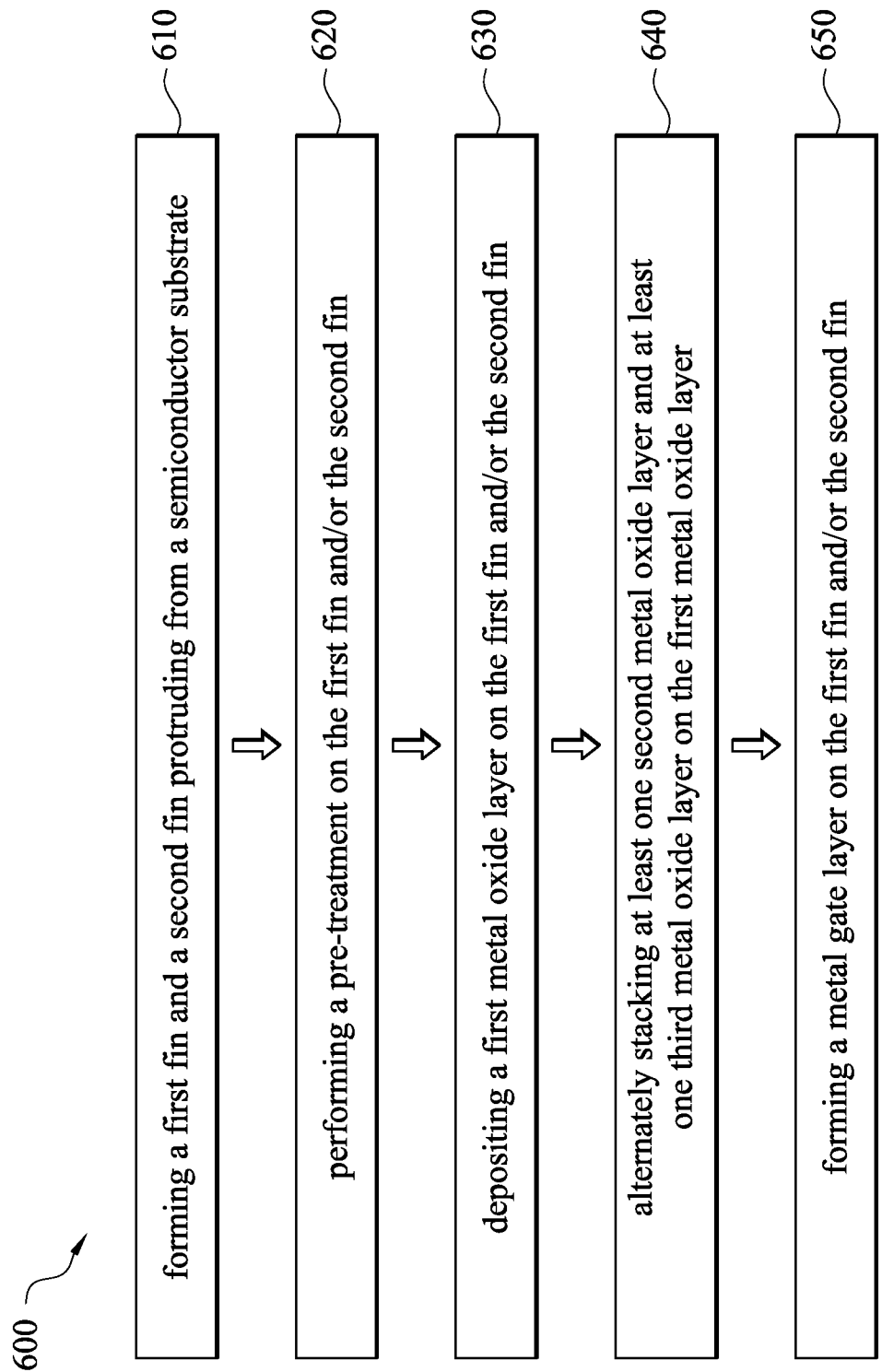
FIG. 6 is a flow chart of a method of forming a nanolaminate structure in accordance with another embodiment of the present disclosure.

FIG. 6 illustrates a flow chart of a method 600 of forming a nanolaminate structure in accordance with various embodiments of the present disclosure. The method 600 is described in relation to FIG. 4A to FIG. 4R and FIG. 4N' to FIG. 4S'. At operation 610, a first fin and a second fin are formed to protrude from a semiconductor substrate, as shown in FIG. 4A to FIG. 4M. At operation 620, a pre-treatment is performed on the first fin and/or the second fin. At operation 630, a first metal oxide layer is deposited on the first fin and/or the second fin. At operation 640, at least one second metal oxide layer and at least one third metal oxide layer are alternately stacked on the first metal oxide layer, as shown in FIG. 4N to FIG. 4O, FIG. 4R and FIG. 4N' to FIG. 4Q'. At operation 650, a metal gate layer is formed on the first fin and/or the second fin, as shown in FIG. 4P to FIG. 4Q and FIG. 4P' to FIG. 4S'.

The nanolaminate structure of the present disclosure includes high dielectric materials, and thus diffusion of elements in the active regions or in the semiconductor substrate is effectively inhibited. A density of interface trap is lowered down and a smaller EOT is realized, and thus the problem such as gate current leakages is improved and a size of the semiconductor device may be further scaling down. It is noted that the elements (e.g. Ge) diffused out from the semiconductor during heating operations (such as the annealing process) of producing the semiconductor device, can be further driven back into the semiconductor device by the first metal oxide layer and the third metal oxide layer. Therefore, the nanolaminate structure of the present disclosure can keep high dielectric constant and smaller EOT, thereby improving a problem of gate current leakage.

In accordance with one embodiment, the present disclosure provides a method of forming a nanolaminate structure. First, a pre-treatment is performed on a semiconductor substrate, in which the semiconductor substrate includes SiGe. Then, a first metal oxide layer is formed on the semiconductor substrate. Then, at least one second metal oxide layer and at least one third metal oxide layer are alternately stacked on the first metal oxide layer, thereby forming the nanolaminate structure. And, a conductive gate layer is formed on the nanolaminate structure.

In accordance with another embodiment, the present disclosure provides a method of forming a nanolaminate structure. First, a first fin and a second fin are formed to protrude from a semiconductor substrate, in which at least one of the first fin and the second fin includes germanium. Next, a pre-treatment is performed on the first fin and/or the second fin. Then, a first metal oxide layer is deposited on the first fin and/or the second fin. Next, at least one second metal oxide layer and at least one third metal oxide layer are alternately stacked on the first metal oxide layer, thereby forming a nanolaminate structure on the first metal oxide layer. Then, a metal gate layer is formed on the first fin and/or the second fin. The second metal oxide layer includes hafnium oxide ($HfO_2$), and the first metal oxide layer and the third metal oxide layer respectively include aluminum oxide ($Al_2O_3$), lanthanum oxide ($La_2O_3$) or yttrium oxide ($Y_2O_3$).

In accordance of yet embodiment, the present disclosure provides a semiconductor device, in which the semiconductor device includes a semiconductor substrate, a fin disposed on the semiconductor substrate, a nanolaminate structure and a metal gate. The nanolaminate structure includes a first metal oxide layer disposed on the fin, a plurality of second metal oxide layers and a plurality of third metal oxide layer alternately stacked on the first metal oxide layer. One of the plurality of the second metal oxide layer is directly disposed on the first metal oxide layer, the second metal oxide layer includes hafnium oxide ($HfO_2$), and the first metal oxide layer and the plurality of the third metal oxide layers respectively include aluminum oxide ($Al_2O_3$), lanthanum oxide ($La_2O_3$) or yttrium oxide ($Y_2O_3$).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a silicon germanium (SiGe) fin within an N-well region in a semiconductor substrate and a silicon fin within a P-well region bordering the N-well region;
    forming a dummy gate extending across the SiGe fin and the silicon fin;
    removing a first portion of the dummy gate from the SiGe fin within the N-well region, while remaining a second portion of the dummy gate across the silicon fin within the P-well region;
    forming a first metal oxide layer at a first temperature, the first metal oxide layer having a first portion extending within the N-well region and across the SiGe fin to contact an end surface of a gate oxide under the second portion of the dummy gate within the P-well region, and a second portion extending upwardly from the first portion of the first metal oxide layer along and in contact with a sidewall of the second portion of the dummy gate to a position higher than a topmost position of the first portion of the first metal oxide layer;
    depositing a second metal oxide layer that includes hafnium on the first metal oxide layer, wherein the first and second metal oxide layers define an interface therebetween;
    depositing a third metal oxide layer on the second metal oxide layer, wherein the third metal oxide layer is deposited at a second temperature that is greater than the first temperature, and the first metal oxide layer and the third metal oxide layer are made of the same material;
    depositing a fourth metal oxide layer on the third metal oxide layer, wherein the third metal oxide layer and the fourth metal oxide layer are made of different materials; and
    forming a conductive gate layer on the fourth metal oxide layer.

2. The method of claim 1, wherein the second metal oxide layer comprises hafnium oxide ($HfO_2$).

3. The method of claim 1, wherein forming the first metal oxide layer comprises alternately flowing a first source comprising aluminum, lanthanum or yttrium over the SiGe fin and the silicon fin, and flowing an oxygen source over the SiGe fin and the silicon fin.

4. The method of claim 1, wherein depositing the third metal oxide layer comprises alternately flowing a first source comprising aluminum, lanthanum or yttrium over the first metal oxide layer, and flowing an oxygen source over the first metal oxide layer.

5. The method of claim 1, wherein depositing the fourth metal oxide layer comprises alternately flowing a second source comprising hafnium over the first metal oxide layer, and flowing an oxygen source over the first metal oxide layer.

6. The method of claim 1, wherein a stack of the second, third and fourth metal oxide layers has an equivalent oxide thickness (EOT) substantially equal to or smaller than 1.5 nm.

7. The method of claim 3, further comprising performing a pre-pulse operation prior to forming the first metal oxide layer, wherein the pre-pulse operation is performed by discontinuously flowing the first source over the semiconductor substrate.

8. A method of forming a semiconductor device, the method comprising:
    forming a SiGe fin and a silicon fin protruding from a semiconductor substrate;
    forming a dummy gate extending across the SiGe fin and the silicon fin;
    removing a first portion of the dummy gate from the SiGe fin, while remaining a second portion of the dummy gate over the silicon fin;
    depositing a metal oxide nanolaminate structure extending across the SiGe fin and over the second portion of the dummy gate, the metal oxide nanolaminate structure being in contact with a sidewall of the second portion of the dummy gate and including alternatingly stacked aluminum oxide ($Al_2O_3$) layers and hafnium oxide ($HfO_2$) layers;

forming a first metal gate layer on the metal oxide nanolaminate structure;

removing a portion of the metal oxide nanolaminate structure from above the second portion of the dummy gate, while leaving a portion of the metal oxide nanolaminate structure in contact with the sidewall of the second portion of the dummy gate; and replacing the second portion of the dummy gate with a second metal gate layer.

9. The method of claim 8, wherein the nanolaminate structure has an equivalent oxide thickness (EOT) substantially equal to or smaller than 1.5 nm.

10. The method of claim 8, further comprising performing a pre-treatment on the SiGe fin and the silicon fin prior to depositing the metal oxide nanolaminate structure.

11. The method of claim 8, wherein a bottommost one of the $Al_2O_3$ layers is formed at a temperature lower than a temperature of forming the other one of the $Al_2O_3$ layers.

12. The method of claim 8, wherein a bottommost one of the $Al_2O_3$ layers is formed at a temperature lower than a temperature of forming the $HfO_2$ layers.

13. The method of claim 8, wherein a bottommost one of the $Al_2O_3$ layers is formed at a temperature lower than 100° C.

14. The method of claim 8, further comprising:
annealing the metal oxide nanolaminate structure.

15. A method of forming a semiconductor device, the method comprising:

forming a first fin and a second fin protruding from a semiconductor substrate, wherein the first fin comprises SiGe and the second fin comprises Si;

forming a dummy gate extending across the first fin and the second fin;

removing a first portion of the dummy gate from the first fin, wherein the second fin remains covered by a second portion of the dummy gate;

after removing the first portion of the dummy gate from the first fin, forming a first metal oxide nanolaminate structure across the first fin, the first metal oxide nanolaminate structure having a first vertical portion extending vertically and in contact with a sidewall of the second portion of the dummy gate, wherein forming the first metal oxide nanolaminate structure comprises:

depositing a first aluminum oxide ($Al_2O_3$) layer on the first fin and in contact with a sidewall of the second portion of the dummy gate at a first temperature; and alternatingly depositing a plurality of hafnium oxide ($HfO_2$) layers and a plurality of second $Al_2O_3$ layers on the first $Al_2O_3$ layer, wherein each of the second $Al_2O_3$ layers are deposited at a second temperature higher than the first temperature of depositing the first $Al_2O_3$ layer;

forming a first metal gate layer on the first metal oxide nanolaminate structure; and after forming the first metal gate layer, removing the second portion of the dummy gate from the second fin; and after removing the second portion of the dummy gate, forming a second metal oxide nanolaminate structure across the second fin, the second metal oxide nanolaminate structure having a second vertical portion extending vertically and in contact with a sidewall of the first vertical portion of the first metal oxide nanolaminate structure, wherein forming the second metal oxide nanolaminate structure comprises:

depositing a third $Al_2O_3$ layer on the second fin and on the sidewall of the first vertical portion of the first metal oxide nanolaminate structure at a third temperature; and alternatingly depositing a plurality of hafnium oxide ($HfO_2$) layers and a plurality of fourth $Al_2O_3$ layers on the third $Al_2O_3$ layer, wherein each of the fourth $Al_2O_3$ layers are deposited at a fourth temperature higher than the third temperature of depositing the third $Al_2O_3$ layer.

16. The method of claim 15, wherein the first temperature is lower than 100° C., and the second temperature is in a range from substantially 120° C. to 300° C.

17. The method of claim 15, wherein depositing the first $Al_2O_3$ layer is performed such that the first $Al_2O_3$ layer is in contact with a top surface of a silicon nitride layer on the second portion of the dummy gate.

18. The method of claim 17, further comprising:
removing the silicon nitride layer prior to removing the second portion of the dummy gate.

19. The method of claim 15, wherein the second vertical portion of the second metal oxide nanolaminate structure has a same height as the first vertical portion of the first metal oxide nanolaminate structure.

20. The method of claim 15, wherein the second vertical portion of the second metal oxide nanolaminate structure has a topmost end substantially level with a topmost end of the first vertical portion of the first metal oxide nanolaminate structure.

* * * * *